US012615815B2

(12) United States Patent
Chen et al.

(10) Patent No.: US 12,615,815 B2
(45) Date of Patent: Apr. 28, 2026

(54) SEMICONDUCTOR STRUCTURE INCLUDING DIELECTRIC WALL AND SPACER LAYER AND METHOD FOR FORMING THE SAME

(71) Applicant: Taiwan Semiconductor Manufacturing Company, Ltd., Hsinchu (TW)

(72) Inventors: Hong-Chih Chen, Changhua County (TW); Chun-Sheng Liang, Changhua County (TW); Jhon-Jhy Liaw, Zhudong Township, Hsinchu County (TW); Fu-Hsiang Su, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 523 days.

(21) Appl. No.: 18/177,996

(22) Filed: Mar. 3, 2023

(65) Prior Publication Data

US 2024/0297217 A1 Sep. 5, 2024

(51) Int. Cl.
| | |
|---|---|
| *H10D 62/10* | (2025.01) |
| *H01L 21/768* | (2006.01) |
| *H10D 30/01* | (2025.01) |
| *H10D 30/43* | (2025.01) |
| *H10D 30/67* | (2025.01) |
| *H10D 62/13* | (2025.01) |
| *H10D 64/01* | (2025.01) |
| *H10D 84/01* | (2025.01) |
| *H10D 84/03* | (2025.01) |

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01); *H10D 84/0128* (2025.01)

(58) Field of Classification Search
CPC ............. H10D 30/6735; H10D 64/018; H10D 30/6757; H10D 62/151; H10D 30/014; H10D 30/0195; H10D 62/121; H10D 30/43; H10D 64/017; H10D 84/013
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |

(Continued)

*Primary Examiner* — Changhyun Yi
(74) *Attorney, Agent, or Firm* — Cooper Legal Group, LLC

(57) ABSTRACT

A semiconductor structure includes a first dielectric wall, a first set of nanostructures and a second dielectric wall sequentially arranged in a first horizontal direction. A first gate electrode layer wraps around the first set of nanostructures. A source/drain feature adjoins the first set of nanostructures and is sandwiched between the first dielectric wall and the second dielectric wall. An inner spacer layer is interposed between the first gate electrode layer and the source/drain feature and between the first set of nanostructures. In a plan view, a first dimension of the inner spacer layer in the first horizontal direction is greater than a second dimension of the source/drain feature in the first horizontal direction.

20 Claims, 27 Drawing Sheets

(56)  References Cited

U.S. PATENT DOCUMENTS

| | | | |
|---|---|---|---|
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2017/0170294 A1* | 6/2017 | Doris | H10D 62/151 |
| 2018/0190829 A1* | 7/2018 | Song | H01L 21/02532 |

* cited by examiner

SEMICONDUCTOR STRUCTURE INCLUDING DIELECTRIC WALL AND SPACER LAYER AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1B-1 is a perspective view illustrating of the formation of a semiconductor structure at one of the intermediate stages, in accordance with some embodiments of the disclosure.

FIG. 1B-2 is a cross-sectional view of the semiconductor structure corresponding to line Y-Y of FIG. 1B-1, in accordance with some embodiments of the disclosure.

FIG. 1C-1 is a perspective view illustrating of the formation of a semiconductor structure at one of the intermediate stages, in accordance with some embodiments of the disclosure.

FIGS. 1C-2 and 1C-3 are cross-sectional views of the semiconductor structure corresponding to line Y1-Y1 and line Y2-Y2 of FIG. 1C-1, in accordance with some embodiments of the disclosure.

FIG. 1D-1 is a perspective view illustrating of the formation of a semiconductor structure at one of the intermediate stages, in accordance with some embodiments of the disclosure.

FIG. 1D-2 is a cross-sectional view of the semiconductor structure corresponding to line Y-Y of FIG. 1D-1, in accordance with some embodiments of the disclosure.

FIG. 1E-1 is a perspective view illustrating of the formation of a semiconductor structure at one of the intermediate stages, in accordance with some embodiments of the disclosure.

FIG. 1E-2 is a cross-sectional view of the semiconductor structure corresponding to line Y-Y of FIG. 1E-1, in accordance with some embodiments of the disclosure.

FIG. 1E-3 illustrates the semiconductor structure of FIG. 1E-1 cut along plan XY of FIG. 1E-1, in accordance with some embodiments of the disclosure.

FIG. 1H-1 is a perspective view illustrating of the formation of a semiconductor structure at one of the intermediate stages, in accordance with some embodiments of the disclosure.

FIG. 1H-2 is a cross-sectional view of the semiconductor structure corresponding to line Y-Y of FIG. 1H-1, in accordance with some embodiments of the disclosure.

FIG. 1J-1 is a perspective view illustrating of the formation of a semiconductor structure at one of the intermediate stages, in accordance with some embodiments of the disclosure.

FIG. 1J-2 is a top view illustrating of the semiconductor structure of FIG. 1J-1, in accordance with some embodiments of the disclosure.

FIGS. 1J-3, 1J-4 and 1J-5 are cross-sectional views of the semiconductor structure corresponding to line Y1-Y1, line Y2-Y2 and line Y3-Y3 of FIG. 1J-2, in accordance with some embodiments of the disclosure.

FIG. 1J-6 illustrates the semiconductor structure of FIG. 1J-1 cut along plan XY of FIG. 1J-1, in accordance with some embodiments of the disclosure.

FIGS. 1O-1 and 1O-2 are cross-sectional views illustrating of the formation of a semiconductor structure corresponding to line Y4-Y4 and line Y2-Y2 of FIG. 1J-2 at one of the intermediate stages, in accordance with some embodiments of the disclosure.

FIG. 2 is a modification of the semiconductor structure of FIG. 1O-1, in accordance with some embodiments of the disclosure.

FIG. 3 is a modification of the semiconductor structure of FIG. 1O-2, in accordance with some embodiments of the disclosure.

FIG. 4 is a modification of the semiconductor structure of FIG. 1O-1, in accordance with some embodiments of the disclosure.

FIG. 6 is a modification of the semiconductor structure of FIG. 1O-1, in accordance with some embodiments of the disclosure.

DETAILED DESCRIPTION

Figure 1A:
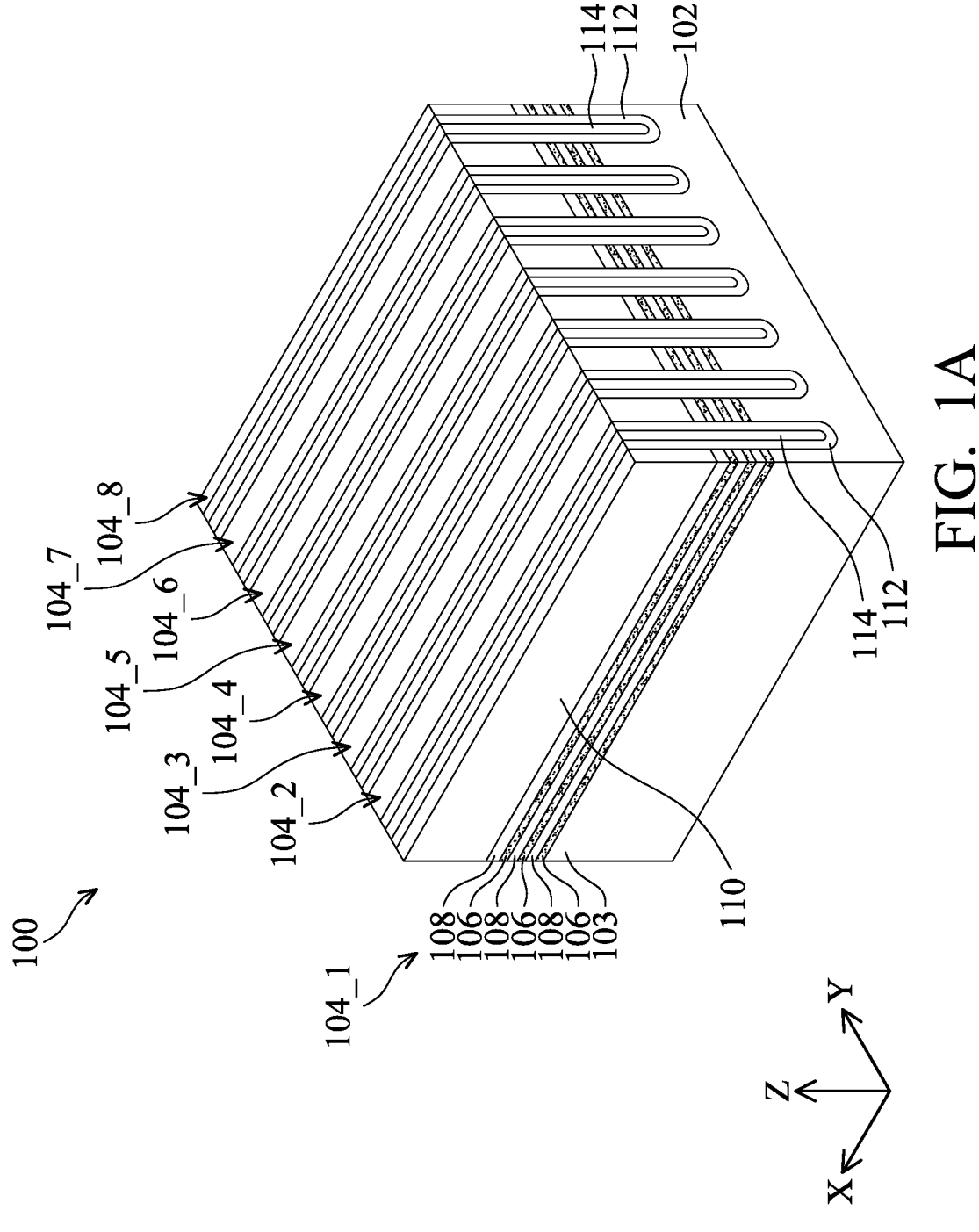
FIG. 1A is a perspective view illustrating of the formation of a semiconductor structure at one of the intermediate stages, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned using any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure and a method for forming the semiconductor structure are provided. The aspect of the present disclosure is directed to a semiconductor structure including nanostructure transistors. The semiconductor structure may include sets of nanostructures, a final gate stack surrounding the sets of nanostructures, and dielectric walls cutting the final gate stack into segments that are electrically isolated from one another. Because the dielectric walls are formed self-aligned between the active regions, the final gate stack is cut by the dielectric walls without forming additional cutting structures. Therefore, it may facilitate the scaling down of the cell height of the resulting semiconductor device.

Furthermore, the formation of the semiconductor structure may include forming fin spacer layers alongside the active regions. The presence of the fin spacer layers may provide more space for the etchant to laterally etch the epitaxial source/drain features, which may help in shaping the source/drain features to have the desired profile. In addition, the semiconductor structure may include inner spacer layers with H-shaped or stair-shaped profiles, which may further block the etchant from damaging the source/drain features during the etching process for forming the nanostructures. Therefore, the reliability and manufacturing yield of the resulting semiconductor device may improve.

Figures 1, 1B, 2:
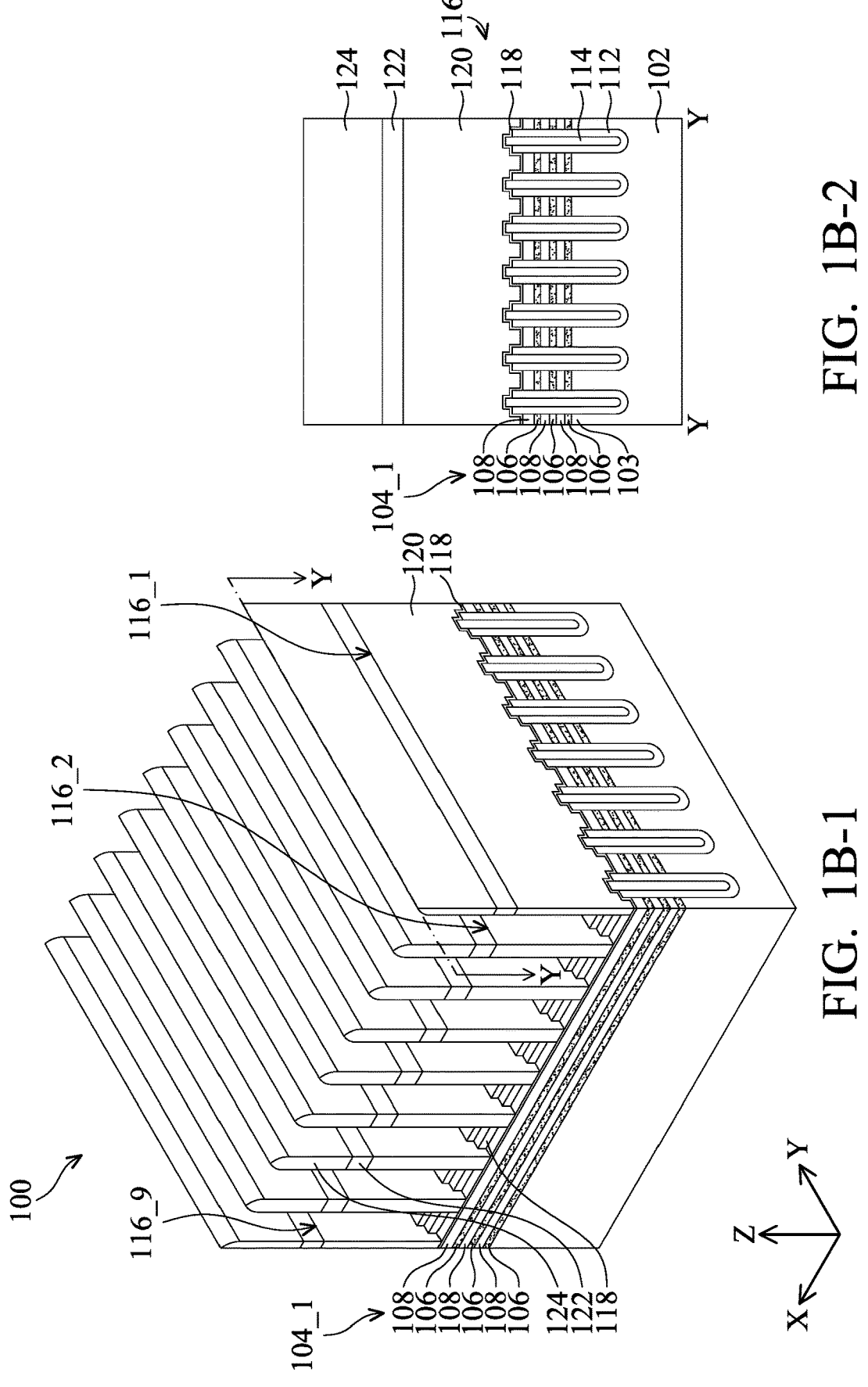

FIGS. 1A through 1O-2 are schematic views illustrating the formation of a semiconductor structure 100 at various intermediate stages, in accordance with some embodiments of the disclosure. FIG. 1A is a perspective view of a semiconductor structure 100 after the formation of the active regions 104, fin spacer layers 112 and dielectric walls 114, in accordance with some embodiments of the disclosure. The frontside of the semiconductor structure 100 faces upward, in accordance with some embodiments. The semiconductor structure 100 includes a substrate 102 and a plurality of active regions 104 (e.g., including 104_1 to 104_8) over the substrate 102, a plurality of fin spacer layers 112 between the active regions 104, and a plurality of dielectric walls 114 nested within the fin spacer layers 112, as shown in FIG. 1A, in accordance with some embodiments.

For a better understanding of the semiconductor structure 100, X-Y-Z coordinate reference is provided in the figures of the present disclosure. The X-axis and Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The active regions 104 have longitudinal axes parallel to the X direction, in accordance with some embodiments. In some embodiments, the active regions 104 are also referred to as fins or fin structures. Each of the active regions 104 are defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same. The X direction may also be referred to as the channel-extending direction. The current of the resulting semiconductor device (i.e., nanostructure transistor) flows in the X direction through the channel. Gate structures or gate stacks will be formed with longitudinal axes parallel to the Y direction and extend over the channel regions of the active regions 104. The Y direction may also be referred to as a gate-extending direction.

The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

In some embodiments, n-type wells and p-type wells (not shown) are formed in the substrate 102 using ion implantation processes. In some embodiments, the respective concentrations of the dopants in the n-type wells and p-type are in a range from about $10^{16}/cm^{-3}$ to about $10^{18}/cm^{-3}$. In some embodiments, the ion implantation processes may be performed several times with different dosages and different energy intensities. In some embodiments, the ion implantation process may include anti-punch through (APT) implant.

The active regions 104 may be formed in different wells of the substrate 102. For example, the active regions 104_1, 104_3, 104_5 and 104_7 are formed in the n-type wells, and the active regions 104_2, 104_4, 104_6 and 104_8 are formed in the p-type wells, in accordance with some embodiments. It should be noted that the number of the active regions in a well may be dependent on the demands on the design of the semiconductor device and/or performance considerations. In alternative embodiments, the active regions 104_1, 104_2, 104_5 and 104_6 are formed in the n-type wells, and the active regions 104_3, 104_4, 104_7 and 104_8 are formed in the p-type wells.

In some embodiments, the active regions 104 extend in the X direction. That is, the dimensions (lengths) of the active regions 104 in the X direction are greater than the dimensions (widths) of the active regions 104 in the Y direction. The formation of the active regions 104 includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge^y$, where y is less than about 0.4, and x>y.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as the channel for the resulting semiconductor device (such as nanostructure transistors), in accordance with some embodiments. Although three first semiconductor layers 106 and three second semiconductor layers 108 are shown in FIG. 1A, the number is not limited to three, and can be two or four, and is less than ten.

The formation of the active regions 104 further includes forming mask elements 110 over the epitaxial stack using a patterning process (such as including deposition, photolithography and etching processes), and then etching the epitaxial stack and underlying wells using mask elements 110, thereby forming trenches and the active regions 104 protruding from between trenches, in accordance with some embodiments. In some embodiments, the mask elements 110 are made of dielectric material such silicon oxide, silicon nitride, silicon oxynitride, a multilayer thereof, and/or a combination thereof.

The portion of the n-type wells protruding from between the trenches serves as lower fin elements 103 of the active regions 104_1, 104_3, 104_5 and 104_7, and the portion of the p-type wells protruding from between the trenches serves as lower fin elements 103 of the active regions 104_2, 104_4, 104_6 and 104_8, in accordance with some embodiments. The lower fin elements 103 of the active regions 104_1, 104_3, 104_5 and 104_7 have a different electrically conductive type than the lower fin elements 103 of the active regions 104_2, 104_4, 104_6 and 104_8, in accordance with some embodiments. A remainder of the epitaxial stack (including the first semiconductor layers 106 and the second semiconductor layers 108) serves as the upper fin elements of the active regions 104, in accordance with some embodiments.

Each of the fin spacer layers 112 is formed between two neighboring active regions 104, and each of the dielectric walls 114 is formed over and surrounded by the corresponding fin spacer layer 112, as shown in FIG. 1A, in accordance with some embodiments. In some embodiments, each of the fin spacer layers 112 includes two vertical portions alongside and in contact with the sidewalls of the neighboring active regions 104 and a horizontal portion extending below a dielectric wall 114. In some embodiments, the fin spacer layers 112 and the dielectric walls 114 extend in the X direction. The fin spacer layers 112 and the dielectric walls 114 have longitudinal axes parallel to the X direction, in accordance with some embodiments.

In some embodiments, the fin spacer layers 112 is made of silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the dielectric walls 114 is made of a dielectric material with a dielectric constant (k-value) lower than 7. In some embodiments, the dielectric walls 114 is made of silicon carbon nitride (SiCN), silicon oxycarbonitride (SiOCN), and/or oxygen-doped silicon carbonitride (Si(O)CN), silicon oxide (SiO$_2$), silicon nitride (SiN), silicon carbide (SiC), silicon oxynitride (SiON), a multilayer thereof, or a combination thereof. In some embodiments, the fin spacer layers 112 and the dielectric walls 114 are made of different materials and have a great difference in etching selectivity. In an embodiment, the fin spacer layers 112 are made of silicon oxide, and the dielectric walls 114 are made of silicon carbon nitride (SiCN). The formation of the fin spacer layers 112 and the dielectric walls 114 includes conformally depositing a dielectric material for the fin spacer layers 112 along the substrate 102, the active regions 104 and the mask elements 110 to partially fill the trenches between the active regions 104, and then depositing a dielectric material for the dielectric walls 114 over the dielectric material for the fin spacer layers 112 to overfill the remainder of the trenches, in accordance with some embodiments. The deposition process may be CVD (such as low-pressure CVD (LPCVD), plasma-enhanced CVD (PECVD), high density plasma CVD (HDP-CVD), flowable CVD (FCVD), or high aspect ratio process (HARP)), atomic layer deposition (ALD), another suitable technique, or a combination thereof.

A planarization process is then performed on the dielectric material for the dielectric walls 114 and the dielectric material for the fin spacer layers 112 until the mask elements 110 are exposed, in accordance with some embodiments. The planarization may be chemical mechanical polishing (CMP), etching back process, or a combination thereof. After the planarization, the top surfaces of the mask elements, the fin spacers 112 and the dielectric walls 114 are substantially coplanar, in accordance with some embodiments.

FIG. 1B-1 is a perspective view of a semiconductor structure 100 after the formation of dummy gate structures 116, in accordance with some embodiments of the disclosure. FIG. 1B-2 is a cross-sectional view of the semiconductor structure 100 corresponding to line Y-Y of FIG. 1B-1. Line Y-Y is in a plane parallel to the Y direction and through a dummy gate structure 116.

The mask elements 110 are removed using an etching process (such as an anisotropic etching process such as dry plasma etching, an isotropic etching process such as dry chemical etching, remote plasma etching or wet chemical etching, and/or a combination thereof), thereby exposing the top surfaces of the active regions 104, in accordance with some embodiments. In the etching process, the fin spacers layers 112 may be also recessed, so that the dielectric walls 114 protrude from the fin spacers layers 112, in accordance with some embodiments. The top surfaces of the dielectric walls 114 are higher than the top surfaces of the fin spacers layers 112, and the top surfaces of the fin spacers layers 112 are higher than the top surfaces of the active regions 104, in accordance with some embodiments.

Dummy gate structures 116 (e.g., including 116_1 to 116_9) are formed across the channel regions of the active regions 104, the fin spacer layers 112 and the dielectric walls 114, as shown in FIGS. 1B-1 and 1B-2, in accordance with some embodiments. The dummy gate structures 116 are formed over the top surfaces of the active regions 104, the fin spacer layers 112 and the dielectric walls 114, in accordance with some embodiments. In some embodiments, the dummy gate structures 116 extend in the Y direction. That is, the dummy gate structures 116 have longitudinal axes parallel to the Y direction, in accordance with some embodiments. That is, the dimensions (lengths) of the dummy gate structures 116 in the Y direction are greater than the dimensions (widths) of the dummy gate structures 116 in the X direction.

The dummy gate structures 116 are configured as sacrificial structures to define the footprint of final gate stacks, in accordance with some embodiments. In some embodiments, the dummy gate structures 116 have no portions that extend between the active regions 104, which may facilitate the removal of the gate structures 116 in a subsequent removal process.

Each of the dummy gate structures 116 includes a dummy gate dielectric layer 118 and a dummy gate electrode layer 120 formed over the dummy gate dielectric layer 118, as shown in FIGS. 1B-1 and 1B-2, in accordance with some embodiments. In some embodiments, the dummy gate dielectric layer 118 is conformally formed along the top surfaces of the active regions 104, the top surfaces and the sidewalls of the fin spacers 112, and the top surfaces and the sidewalls of the dielectric walls 114, in accordance with some embodiments. In some embodiments, the dummy gate dielectric layer 118 is made of one or more dielectric materials, such as silicon oxide (SiO), silicon nitride (SiN), silicon oxynitride (SiON), HfO$_2$, HfZrO, HfSiO, HfTiO, HfAlO. In some embodiments, the dielectric material is deposited using ALD, CVD, thermal oxidation, physical vapor deposition (PVD), another suitable technique, or a combination thereof.

In some embodiments, the dummy gate electrode layer 120 is made of semiconductor material such as polysilicon or poly-silicon germanium. In some embodiments, the material for the dummy gate electrode layer 120 is deposited using CVD, ALD, another suitable technique, or a combination thereof. In some embodiments, the formation of the dummy gate structures 116 includes globally and conformally depositing a dielectric material for the dummy gate dielectric layer 118 over the semiconductor structure 100, depositing a material for the dummy gate electrode layer 120 over the dielectric material, planarizing the material for the dummy gate electrode layer 120, and patterning the material for the dummy gate electrode layer 120 and the dielectric material into the dummy gate structures 116.

The patterning process includes forming patterned hard mask layers 122 and 124 over the material for the dummy gate electrode layer 120, in accordance with some embodiments. For example, the patterned hard mask layer 122 is made of nitride such as silicon nitride, and the patterned hard mask layer 124 is made of oxide such as silicon oxide. The patterned hard mask layers 122 and 124 correspond to and overlap the channel regions of the active regions 104, in accordance with some embodiments. The material for the dummy gate electrode layer 120, uncovered by the patterned hard mask layers 122 and 124, are etched away, in accordance with some embodiments.

Figures 1, 1C:
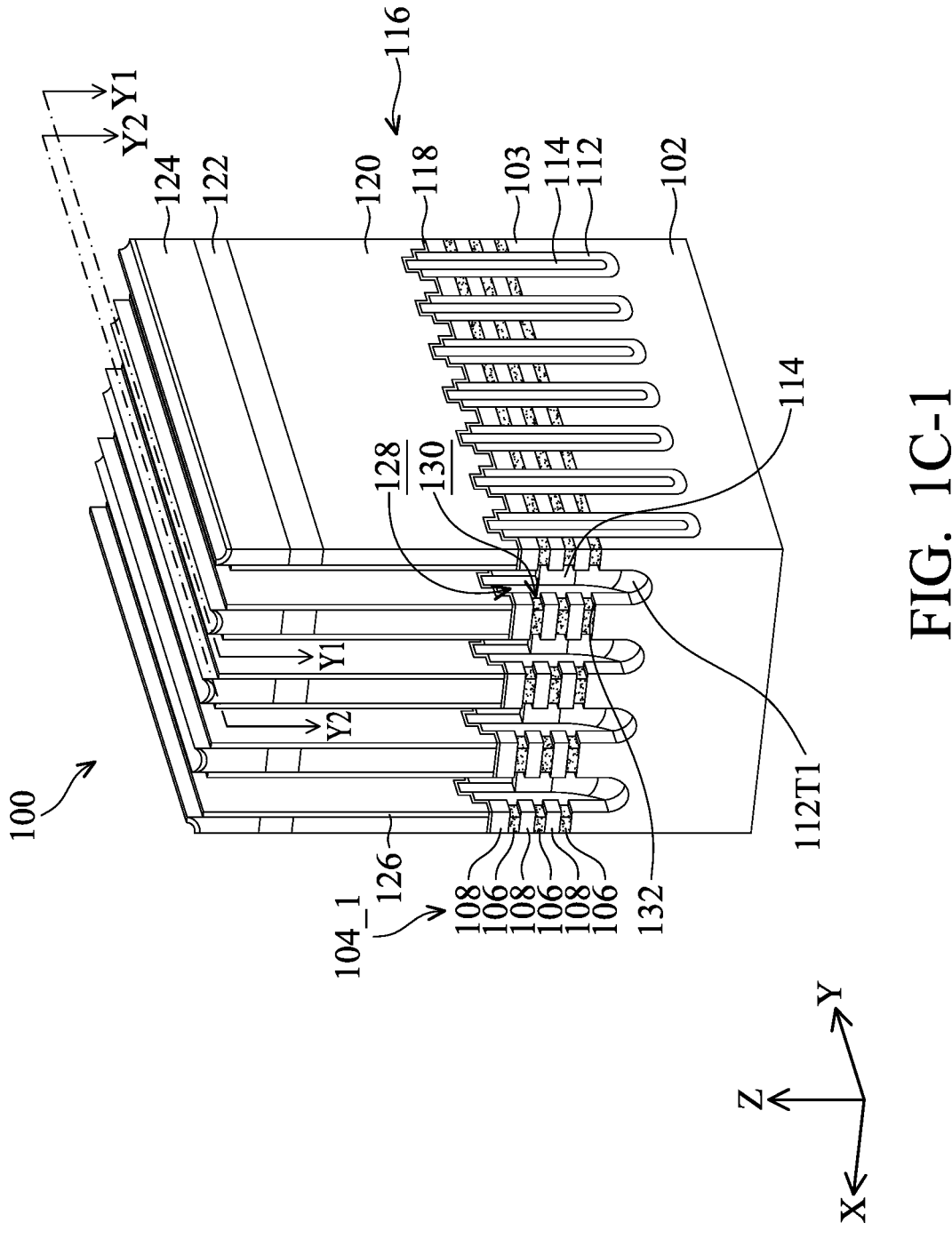

FIG. 1C-1 is a perspective view of a semiconductor structure 100 after the formation of gate spacer layers 126, source/drain recess 128 and notches 130, in accordance with some embodiments of the disclosure. FIGS. 1C-2 and 1C-3 are cross-sectional views of the semiconductor structure 100 corresponding to line Y1-Y1 and line Y2-Y2 of FIG. 1C-1. Line Y1-Y1 is in a plane parallel to the Y direction and across source/drain regions. Line Y2-Y2 is in a plane parallel to the Y direction and through a gate spacer layer 126.

Gate spacer layers 126 are formed along the opposite sidewalls of the dummy gate structures 120, as shown in FIG. 1C-1, in accordance with some embodiments. The gate spacer layers 126 extend in the Y direction and across the active regions 104, the fin spacer layers 112 and the dielectric walls 114, in accordance with some embodiments. The gate spacer layers 126 are used to offset the subsequently formed source/drain features and separate the source/drain features from the gate structure, in accordance with some embodiments. In some embodiments, the gate spacer layers 126 are made of dielectric material, such as silicon oxide (SiO$_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the gate spacer layers 126 are made of low-k dielectric materials. For example, the dielectric constant (k) value of the gate spacer layers 126 may be lower than a k-value of silicon oxide (SiO), such as lower than 4.2, equal to or lower than about 3.9, such as in a range from about 3.5 to about 3.9.

In some embodiments, the formation of the gate spacer layers 126 includes globally and conformally depositing a dielectric material for the gate spacer layers 126 over the semiconductor structure 100, followed by an anisotropic etching process. In some embodiments, the etching process is performed without an additional photolithography process. The portions of the dielectric material that remain on the sidewalls of the dummy gate structures 116 serve as the gate spacer layers 126, in accordance with some embodiments.

An etching process is performed on the semiconductor structure 100 using the dummy gate structures 116 and the gate spacer layers 126 as etch masks, thereby forming source/drain recess 128 in the active regions 104 between the fin spacer layers 112, as shown in FIGS. 1C-1 and 1C-2, in accordance with some embodiments. The etching process may be an anisotropic etching process such as dry plasma etching, an isotropic etching process such as dry chemical etching, remote plasma etching or wet chemical etching, and/or a combination thereof. In some embodiments, the source/drain recesses 128 extend into the lower fin elements 103. In some embodiments, the etching process also recesses the portions the fin spacer layers 112 and the dielectric walls 114 exposed from the dummy gate structures 116 and the gate spacer layers 126, in accordance with some embodiments.

Due to different etching selectivity between the active regions 104, the fin spacer layers 112 and the dielectric walls 114, the recessed upper surface 103U of the lower fin elements 103 are lower than the recessed upper surface 112U1 of the fin spacer layers 112, and the recessed upper surface 112U1 of the fin spacer layers 112 are lower than the recessed upper surface 114U of the dielectric walls 114, in accordance with some embodiments. In some embodiments, the level of the recessed upper surface 112U of the fin spacer layers 112 may descend from one end jointed with the dielectric wall 114 to the other end jointed with the active region 104. In some embodiments, the fin spacer layers 112 have tailing portions 112T1 remaining on the sidewalls of the dielectric walls 114 over the recessed upper surface 103U of the lower fin elements 103. In some embodiments, the tailing portions 112T1 may taper upward.

One or more etching processes are performed to laterally recess the first semiconductor layers 106 of the active regions 104 and the fin spacer layers 112 from the source/drain recesses 128 toward the channel regions (i.e., in the X direction), thereby forming notches 130, as shown in FIGS. 1C-1 and 1C-3, in accordance with some embodiments. The notches 130 are located directly below the gate spacer layers 126, in accordance with some embodiments. In some embodiments, the one or more etching process are an isotropic etching such as dry chemical etching, remote plasma etching, wet chemical etching, another suitable technique, or a combination thereof.

Each of the notches 130 includes two vertical portions 130A formed by recessing the fin spacer layers 112 and a plurality of horizontal portions 130B formed by recessing the first semiconductor layers 106, in accordance with some embodiments. The vertical portions 130A expose the sidewalls of the dielectric wall 114, the tailing portion 112T1 of the fin spacer layers 112, the sidewalls of the second semiconductor layers 108 and the sidewalls of the lower fin elements 103, in accordance with some embodiments. The horizontal portions 130B connect the vertical portions 130A and exposes the top and bottom surfaces of the second semiconductor layers 108 and the top surfaces of the lower fin elements 103, in accordance with some embodiments.

Figures 1, 1C, 2, 3:
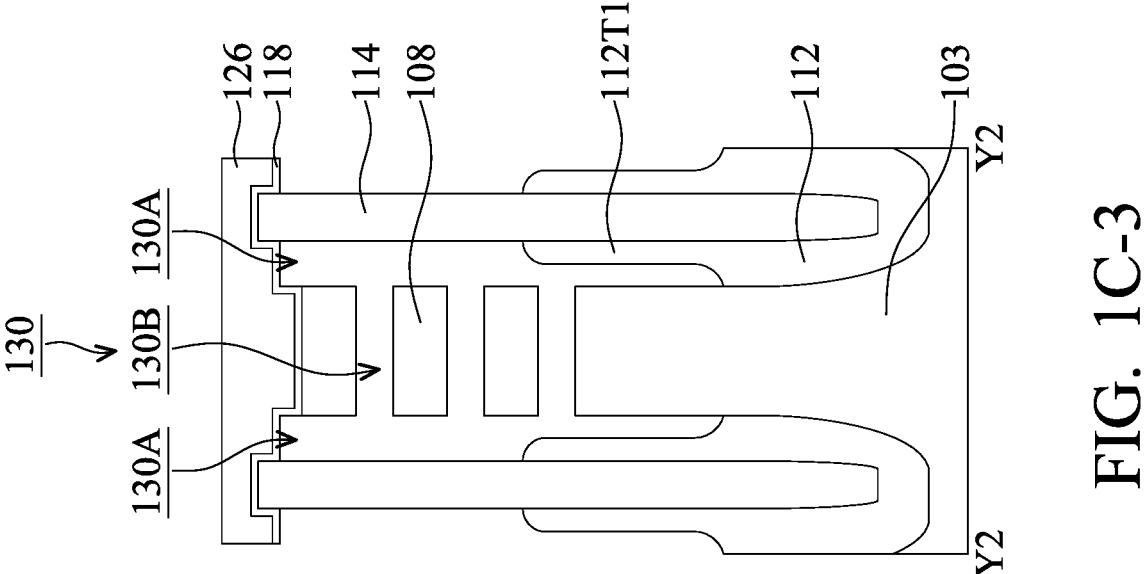
Figures 1, 1C, 2:
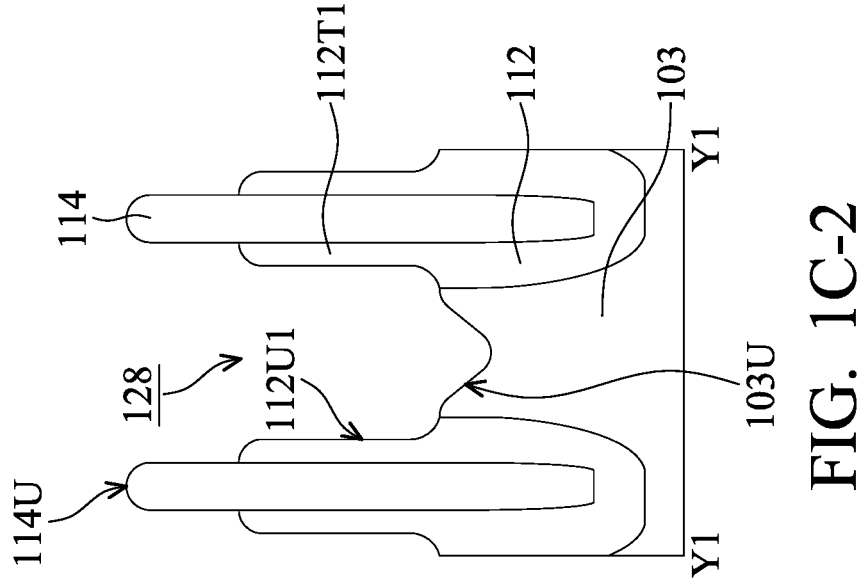
Figures 1, 1D, 2:
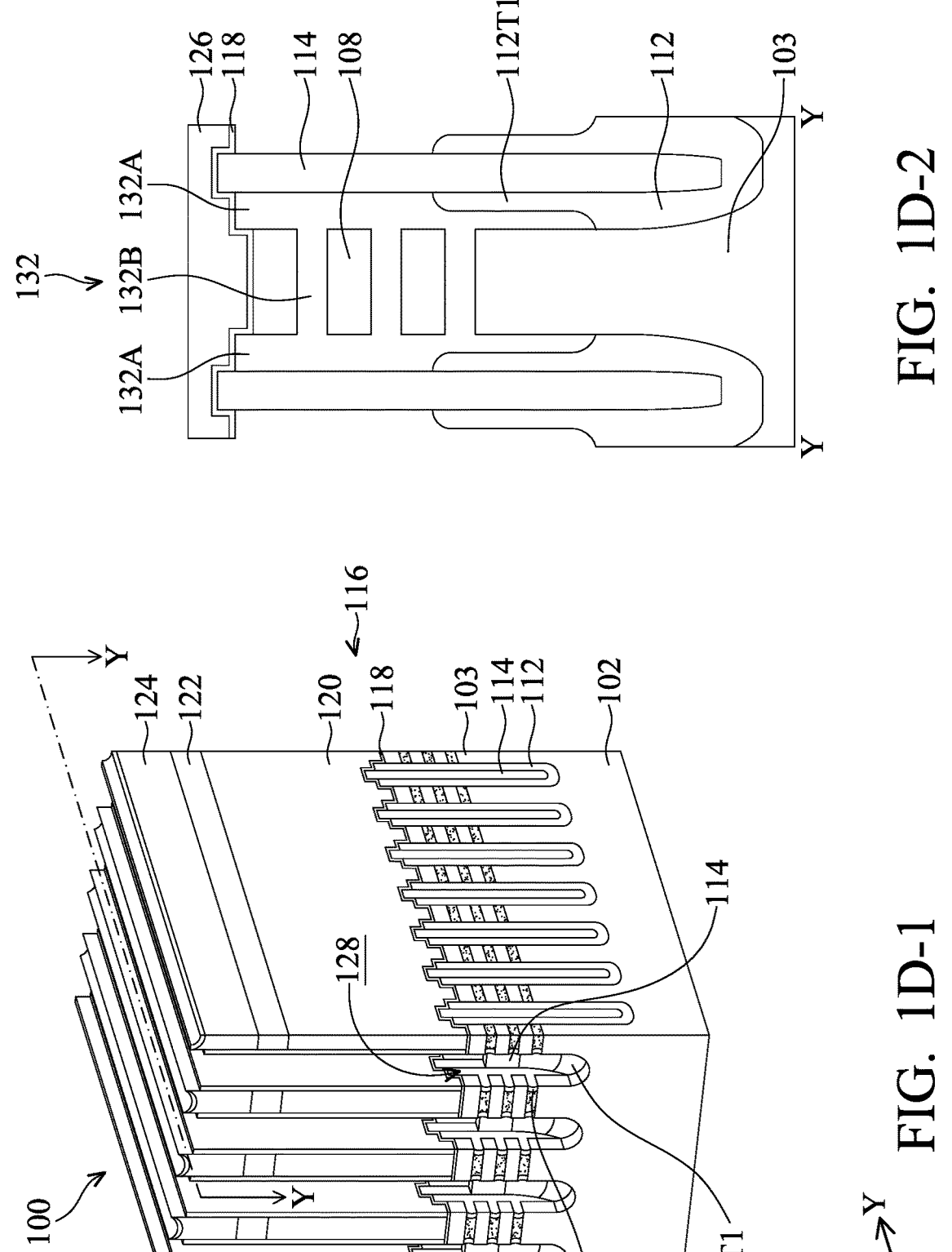

FIG. 1D-1 is a perspective view of a semiconductor structure 100 after the formation of inner spacer layers 132, in accordance with some embodiments of the disclosure. FIG. 1D-2 is a cross-sectional view of the semiconductor structure corresponding to line Y-Y of FIG. 1D-1, in accordance with some embodiments of the disclosure. Line Y-Y is in a plane parallel to the Y direction and through a gate spacer layer 126.

Inner spacer layers 132 are formed in the notches 130 to abut the sidewalls of the recessed first semiconductor layers 106 and the recessed fin spacer layers 112, as shown in FIGS. 1D-1, in accordance with some embodiments. In some embodiments, the inner spacer layers 132 are made of a silicon-containing dielectric material, such as silicon oxide (SiO$_2$), silicon nitride (SiN), silicon carbide (SiC), silicon oxynitride (SiON), silicon carbon nitride (SiCN), silicon oxycarbide (SiOC), silicon oxycarbonitride (SiOCN), and/or oxygen-doped silicon carbonitride (Si(O)CN). In some embodiments, the inner spacer layers 132 are made of fluorine-doped silicon oxide (SiO$_2$:F), boron nitride (BN), HfON, HfOC, and another dielectric material. In some embodiments, the inner spacer layers 132 are made of low-k dielectric materials. For example, the dielectric constant of the inner spacer layers 132 may be lower than a k-value of silicon oxide (SiO), such as lower than 4.2, equal to or lower than about 3.9, such as in a range of about 3.5 to about 3.9.

The formation of the inner spacer layers 132 includes depositing a dielectric material for the inner spacer layers 132 over the semiconductor structure 100 to fill the notches 130, and then etching back the dielectric material to remove the dielectric material outside the notches 130, in accordance with some embodiments. The dielectric material remaining in the notches serve as the inner spacer layers 132, in accordance with some embodiments. In some embodiments, the deposition process includes ALD, CVD (such as PECVD, LPCVD or HARP), another suitable technique, and/or a combination thereof. In some embodiments, the etching back process includes an anisotropic etching process such as dry plasma etching, an isotropic etching process such as dry chemical etching, remote plasma etching or wet chemical etching, and/or a combination thereof.

Each of the inner spacer layers 132 includes two vertical portions 132A and a plurality of horizontal portions 132B connecting the vertical portions 132A, as shown in FIG. 1D-2, in accordance with some embodiments. The vertical portions 132A are in direct contact with the sidewalls of the dielectric walls 114, the tailing portion 112T1 of the fin spacer layers 112, the sidewalls of the second semiconductor layers 108 and the sidewalls of the lower fin elements 103, in accordance with some embodiments. The horizontal portions 132B are in direct contact with the top and bottom surfaces of the second semiconductor layers 108 and the top surfaces of the lower fin elements 103, in accordance with some embodiments. In some embodiments, the inner spacer layers 132 have H-shaped or stair-shaped profiles.

The inner spacer layers 132 interpose subsequently formed source/drain features and gate stack to avoid the source/drain features and the gate stack from being in direct contact and are configured to reduce the parasitic capacitance between the gate stack and the source/drain features (i.e., Cgs and Cgd), in accordance with some embodiments. In addition, the vertical portions 132A of the inner spacer layers 132 may further block the etchant during a subsequent etching process for forming the nanostructures, thereby protecting the source/drain features from being damaged.

Figures 1, 1E:
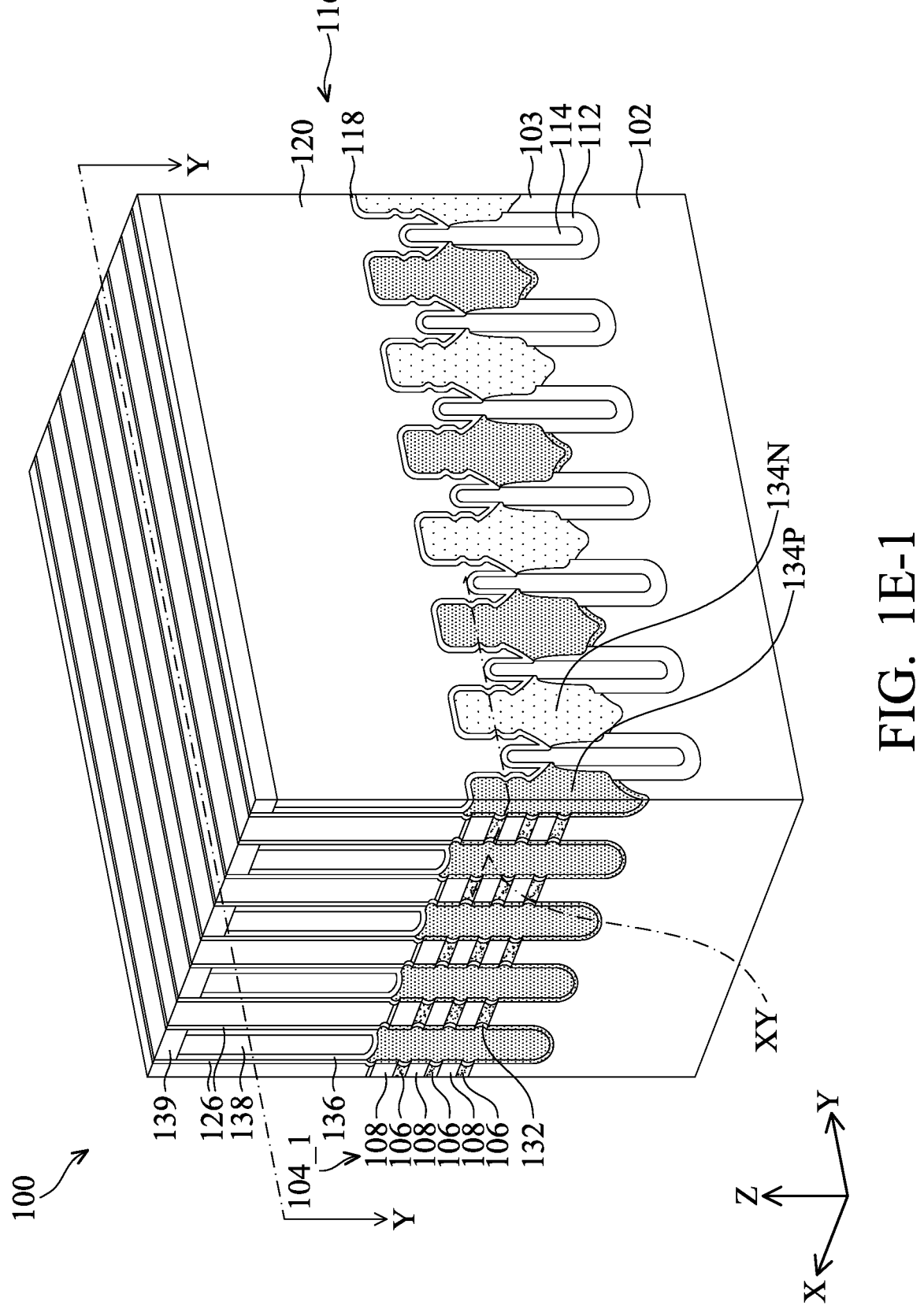
Figures 1, 1E, 2, 3:
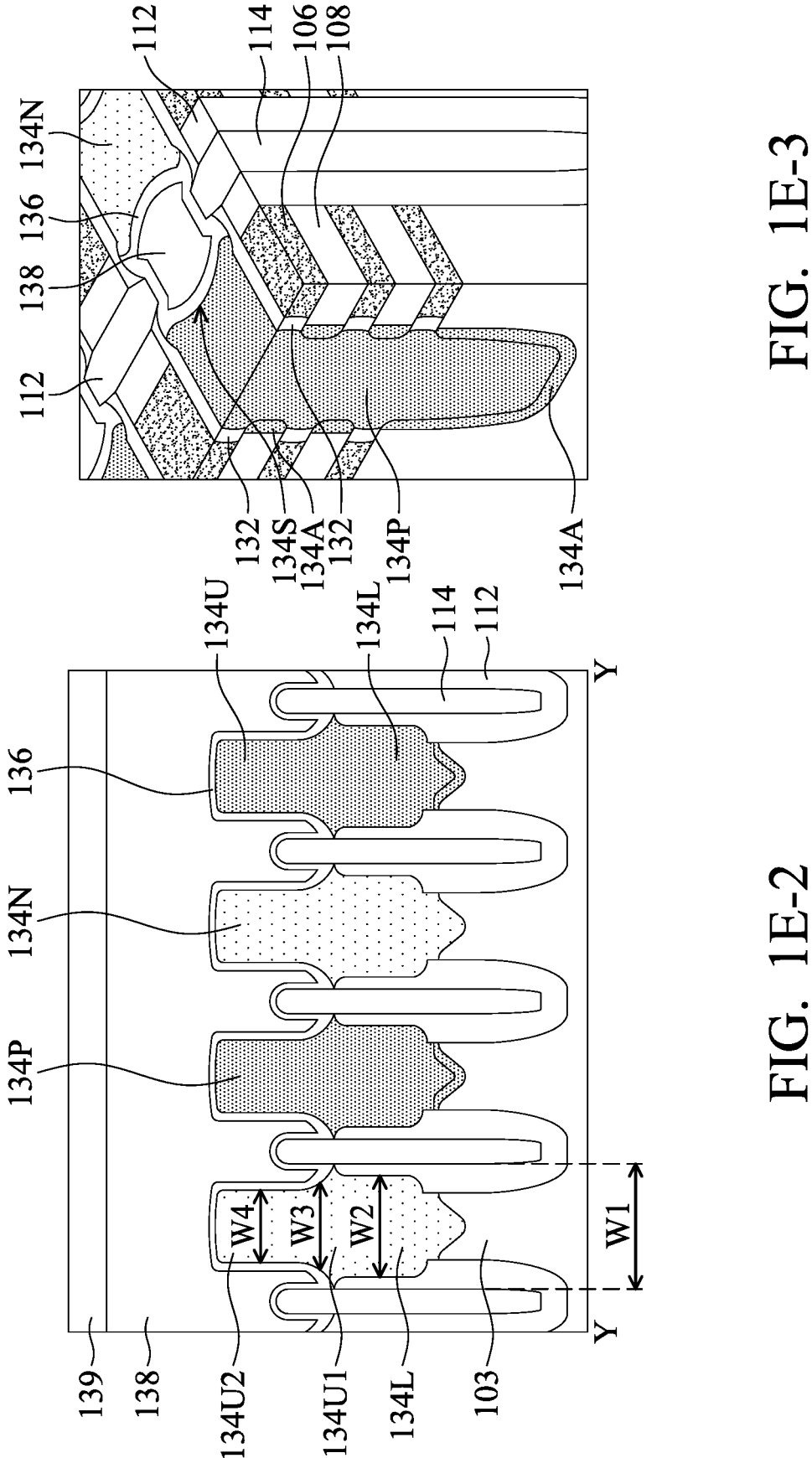

FIG. 1E-1 is a perspective view of a semiconductor structure 100 after the formation of source/drain features 134N and 134P, a contact etching stop layer (CESL) 136, a first interlayer dielectric (ILD) layer 138 and a dielectric capping layer 139, in accordance with some embodiments of the disclosure. FIG. 1E-2 is a cross-sectional view of the semiconductor structure 100 corresponding to line Y-Y of FIG. 1E-1. Line Y-Y is in a plane parallel to the Y direction and across source/drain features 134N and 134P.

Source/drain features 134N and 134P are formed on the lower fin elements 103 of the active regions 104 in the source/drain recesses 128 using one or more epitaxial growth processes, as shown in FIGS. 1E-1 to 1E-2, in accordance with some embodiments. The epitaxial growth process may be MBE, MOCVD, or VPE, another suitable technique, or a combination thereof. In some embodiments, the source/drain features 134P are formed on the active regions 104_1, 104_3, 104_5 and 104_7 over the n-type wells, and the source/drain features 134N are formed on the active regions 104_2, 104_4, 104_6 and 104_8 over the p-type wells. The source/drain features 134N and 134P are formed on opposite sides of the dummy gate structures 116, in accordance with some embodiments.

In some embodiments, the source/drain features 134N have a different electrically conductive type than the source/drain features 134P. In some embodiments, the source/drain features 134N and the source/drain features 134P may be formed separately. For example, a patterned mask layer (such as photoresist layer and/or hard mask layer) may be formed to cover the semiconductor structure 100 over the n-type wells, and then the source/drain features 134N are grown. Afterward, the patterned mask layer may be removed. Similarly, a patterned mask layer (such as photoresist layer and/or hard mask layer) is formed to cover the semiconductor structure 100 over the p-type wells, and then the source/drain features 134P are grown. Afterward, the patterned mask layer may be removed.

In some embodiments, the source/drain features 134N and 134P are in-situ doped during the epitaxial processes. In some embodiments, the source/drain features 134N are doped with the n-type dopant during the epitaxial growth process. For example, the n-type dopant may be phosphorous (P) or arsenic (As). For example, the n-type source/drain features 134N may be the epitaxially grown silicon phosphorous (SiP), silicon carbon (SiC), silicon phosphorous carbon (SiPC), silicon phosphorous arsenic (SiPAs), silicon arsenic (SiAs), silicon (Si) or a combination thereof doped with phosphorous and/or arsenic. In some embodiments, the concentrations of the dopant (e.g., P) in the source/drain features 134N are in a range from about $2\times10^{19}$ $cm^{-3}$ to about $3\times10^{21}$ $cm^{-3}$.

In some embodiments, the source/drain features 134P are doped with the p-type dopant during the epitaxial growth process. For example, the p-type dopant may be boron (B) or $BF_2$. For example, the p-type source/drain features 134P may be the epitaxially grown silicon germanium (SiGe), silicon germanium carbon (SiGeC), germanium (Ge), silicon (Si) or a combination thereof doped with boron (B). In some embodiments, the concentrations of the dopant (e.g., B) in the source/drain features 134P are in a range from about $1\times10^{19}$ $cm^{-3}$ to about $6\times10^{20}$ $cm^{-3}$.

The source/drain features 134P and/or 134N may be multilayered structures. In some embodiments, the source/drain features 134P may be includes barrier layers 134A formed on the semiconductor surface of the second semiconductor layer 108 and the lower fin element 103 and a bulk layer over the barrier layers 134A and filling the source/drain recess, as shown in FIG. 1E-3. The concentration of the dopant in the barrier layers 134A is lower than the concentration of the dopant in the bulk layer, e.g., by 2 orders, in accordance with some embodiments.

In some embodiments, the lattice constant of the source/drain features 134N and the lattice constant of the source/drain features 134P are different from the lattice constant of the second semiconductor layers 108, so that the channel regions of the resulting semiconductor device can be strained or stressed by the source/drain features 134N and 134P, thereby improving carrier mobility of the resulting semiconductor device and enhance the device performance (e.g., on-state current). In some embodiments, the n-type source/drain features 103 134N and the p-type source/drain features 134P are made of different epitaxial materials. For example, the n-type source/drain features 134N are made of SiP, and the p-type source/drain features 134P are made of SiGe.

The epitaxial process is performed with a deposition-etch-deposition (DED) approach, which selectively and intermittently removes deposited epitaxial material, in accordance with some embodiments. The source/drain features 134N and 134P may laterally grow after the epitaxial material protrudes from the dielectric walls 114, in accordance with some embodiments. The deposition-etch-deposition approach removes the laterally growing epitaxial material and may allow the source/drain features 134N and 134P to have narrow upper portions, thereby preventing the adjacent source/drain features 134N and 134P from merging, in accordance with some embodiments. In addition, the presence of the recessed fin spacer layers 112 may provide more space for the etchant to laterally etch the epitaxial material, which may help in shaping the source/drain features to have the desired profile. The source/drain features 134N and/or 134P with narrow widths may reduce the parasitic capacitance (e.g., Cgs and Cgd), thereby improving the performance of the resulting semiconductor device, e.g., speed.

The source/drain feature 134N or 134P has a maximum width W1 in the Y direction at the top of the recessed fin spacer layers 112 (e.g., the ends jointed with the dielectric walls 114), as shown in FIG. 1E-2, in accordance with some embodiments. The source/drain feature 134N or 134P includes a lower portion 134L sandwiched between the adjacent two fin spacer layers 112 and an upper portion 134U protruding from the top of the fin spacer layers 112, as shown in FIG. 1E-2, in accordance with some embodiments. The lower portion 134L is in direct contact with the fin spacer layers 112 and the lower fin element 103, and has a width W2 that gradually decreases downward from the top of the recessed fin spacer layers 112 to the bottom of the source/drain feature 134N or 134P, in accordance with some embodiments. The upper portion 134U may include a lower part 134U1 whose width W3 gradually decreases upward from the top of the recessed fin spacer layers 112 and an upper part 134U2 with a substantially consistent width W4, in accordance with some embodiments. In some embodiment, the upper part 134U2 is thicker (in the Z direction) than the lower part 134U1, and is spaced apart from the dielectric walls 114.

The profile of the source/drain feature 134N and/or 134P may not be limited to that shown in FIG. 1E-2. For example, the upper portion 134U may taper upward to the top of the source/drain feature 134N or 134P. For example, the upper portion 134U may taper downward from the top of the source/drain feature 134N or 134P to the top of the recessed fin spacer layers 112.

A contact etching stop layer 136 is formed over the semiconductor structure 100 to cover the source/drain features 134N and 134P, as shown in FIGS. 1E-1 and 1E-2, in accordance with some embodiments. The contact etching stop layer 136 is further formed along, and covers, the dielectric walls 114 and the gate spacer layers 126, in accordance with some embodiments. In some embodiments, the contact etching stop layer 136 is made of dielectric material, such as silicon nitride (SiN), silicon oxide (SiO₂), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 136 is globally and conformally deposited over the semiconductor structure 100 using CVD (such as LPCVD, PECVD, HDP-CVD, or HARP), ALD, another suitable method, or a combination thereof.

A first interlayer dielectric layer 138 is formed over the contact etching stop layer 136, as shown in FIGS. 1E-1 and 1E-2, in accordance with some embodiments. The first interlayer dielectric layer 138 overfills the space between dummy gate structures 116, in accordance with some embodiments. In some embodiments, the first interlayer dielectric layer 138 includes a portion that extends between source/drain features 134N (or 134P) and the dielectric walls 114. In some embodiments, the first interlayer dielectric layer 138 is made of dielectric material, such as un-doped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material.

In some embodiments, the first interlayer dielectric layer 138 and the contact etching stop layer 136 are made of different materials and have a great difference in etching selectivity. In some embodiments, the dielectric material for the first interlayer dielectric layer 138 is deposited using CVD (such as HDP-CVD, PECVD, HARP or FCVD), another suitable technique, or a combination thereof. The dielectric materials for the contact etching stop layer 136 and the first interlayer dielectric layer 138 above the top surface of the dummy gate electrode layer 120 are removed using, for example, CMP, in accordance with some embodiments.

FIG. 1E-3 illustrates the semiconductor structure 100 of FIG. 1E-1 cut along plan XY of FIG. 1E-1, in accordance with some embodiments of the disclosure. In some embodiments, the source/drain features 134N and 134P have curved sidewalls (e.g., concave) 134S due to the DED approach. In some embodiments, the inner spacer layer 132 extends beyond the sidewalls 134S (or the edges) of the source/drain features 134N and 134P in the Y direction. In some embodiments, the contact etching stop layer 136 is in direct contact with the portions of the inner spacer layer 132 extending beyond the sidewalls 134S of the source/drain features 134N and 134P.

The top portion of the first interlayer dielectric layer 138 is replaced by dielectric capping layers 139 using such processes as etching, deposition, and CMP processes, as shown in FIGS. 1E-1 and 1E-2, in accordance with some embodiments. In some embodiments, the dielectric capping layers 139 are made of dielectric material, such as silicon nitride (SiN), silicon oxide (SiO₂), silicon oxynitride (SiOC), silicon carbide (SiC), oxygen-doped silicon carbide (SiC:O), oxygen-doped silicon carbonitride (Si(O)CN), or a combination thereof. In some embodiments, the first interlayer dielectric layer 138 and the dielectric capping layers 139 are made of different materials and have a great difference in etching selectivity. In some embodiments, the dielectric capping layers 139 may protect the first interlayer dielectric layer 138 in subsequent etching processes.

Figure 1G:
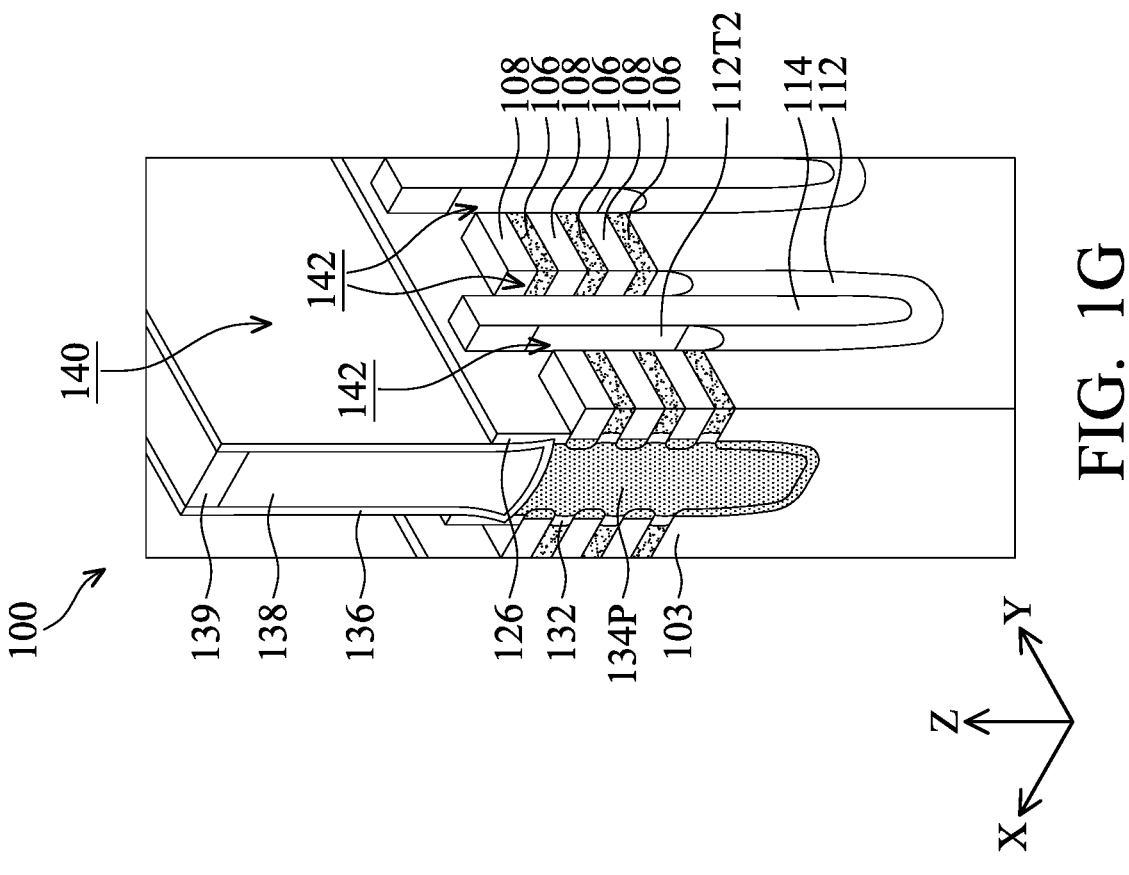
FIG. 1G is a perspective view illustrating of the formation of a semiconductor structure at one of the intermediate stages, in accordance with some embodiments of the disclosure.
Figure 1F:
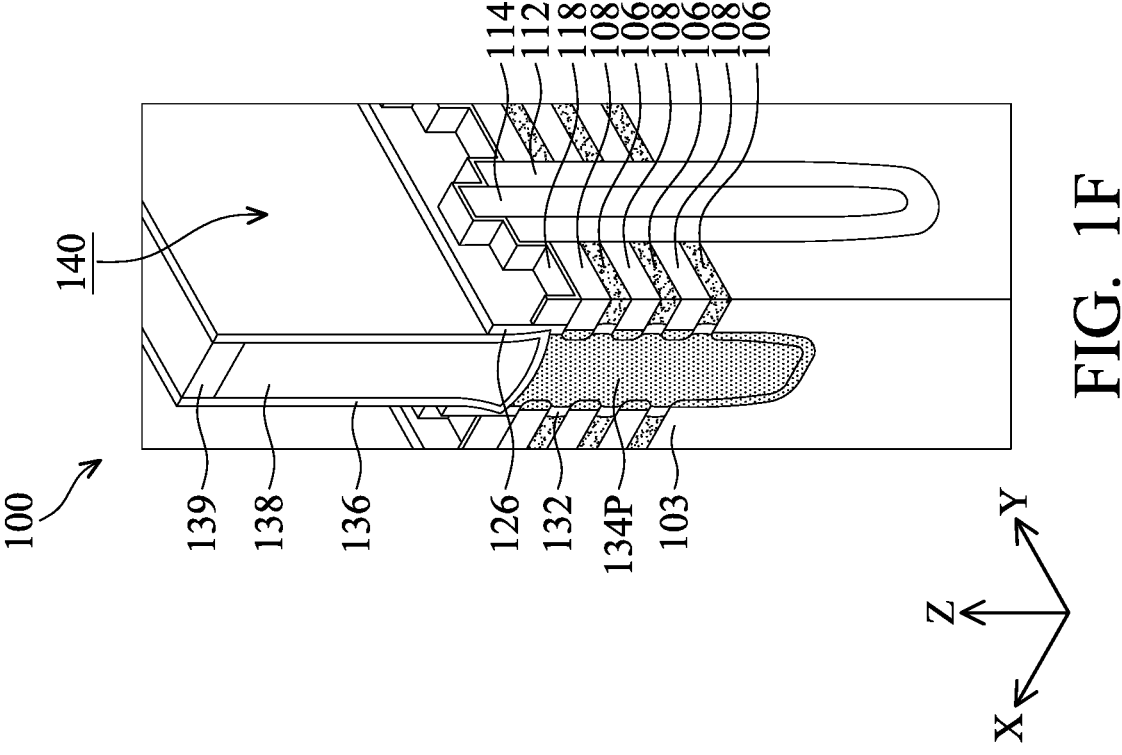
FIG. 1F is a perspective view illustrating of the formation of a semiconductor structure at one of the intermediate stages, in accordance with some embodiments of the disclosure.

FIG. 1F is a perspective view of a semiconductor structure 100 after the removal of the dummy gate electrode layer 120, in accordance with some embodiments of the disclosure. The dummy gate electrode layer 120 is removed using an etching process, thereby exposing the dummy gate dielectric layer 118, as shown in FIG. 1F, in accordance with some embodiments. Gate trenches 140 are formed in the first interlayer dielectric layer 138, in accordance with some embodiments. For example, when the dummy gate electrode layer 120 is made of polysilicon, a wet etchant such as a tetramethylammonium hydroxide (TMAH) solution may be used to selectively remove the dummy gate electrode layer 120.

Because the dummy gate structures 116 are formed over the top surfaces of the active regions 104, the fin spacer layers 112 and the dielectric walls 114 and do not extend between the sidewalls the active regions 104, the difficulty of the etching process for removing the dummy gate electrode layer 120 may be reduced, in accordance with some embodiments. Therefore, the risk of the dummy gate electrode layer 120 that remains on the active regions 104 may decrease, thereby improving the reliability and manufacturing yield of the resulting semiconductor device.

FIG. 1G is a perspective view of a semiconductor structure 100 after the removal of the dummy gate dielectric layer 118 and the formation of recesses 142, in accordance with some embodiments of the disclosure. The dummy gate dielectric layer 118 is removed using an etching process, thereby exposing the top surfaces of the channel regions of the active regions 104 and the fin spacer layers 112 and the dielectric walls 114, in accordance with some embodiments. For example, the dummy gate dielectric layer 118 may be removed using a plasma dry etching, a dry chemical etching, and/or a wet etching.

An etching process is then performed to recess the fin spacer layers 112, thereby forming recesses 142, as shown in FIG. 1G, in accordance with some embodiments. The etching process may be an anisotropic etching process such as dry plasma etching, an isotropic etching process such as dry chemical etching, remote plasma etching or wet chemical etching, and/or a combination thereof. In some embodiments, the recesses 142 expose the opposite sidewalls of the active regions 104. In some embodiments, the etching process is performed until the bottommost first semiconductor layers 106 are exposed. In some embodiments, the lower fin element 103 may be also partially exposed from the recesses 142. In some embodiments, the fin spacer layers 112 have tailing portions 112T2 remaining on the sidewalls of the dielectric walls 114. In some embodiments, the tailing portions 112T2 of the fin spacer layers 112 may taper upward.

Figures 1, 1H, 2:
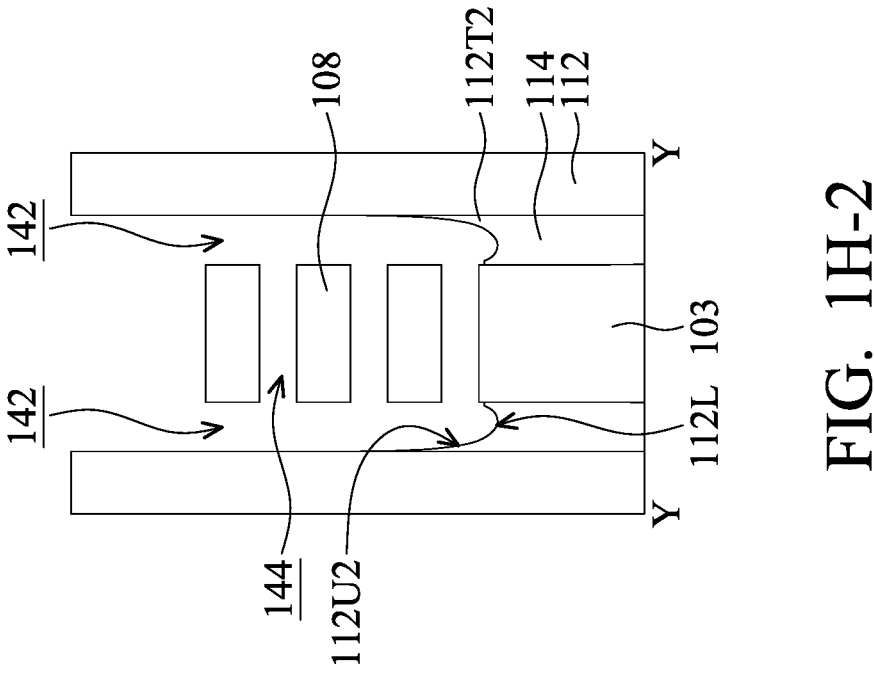
Figures 1, 1H:
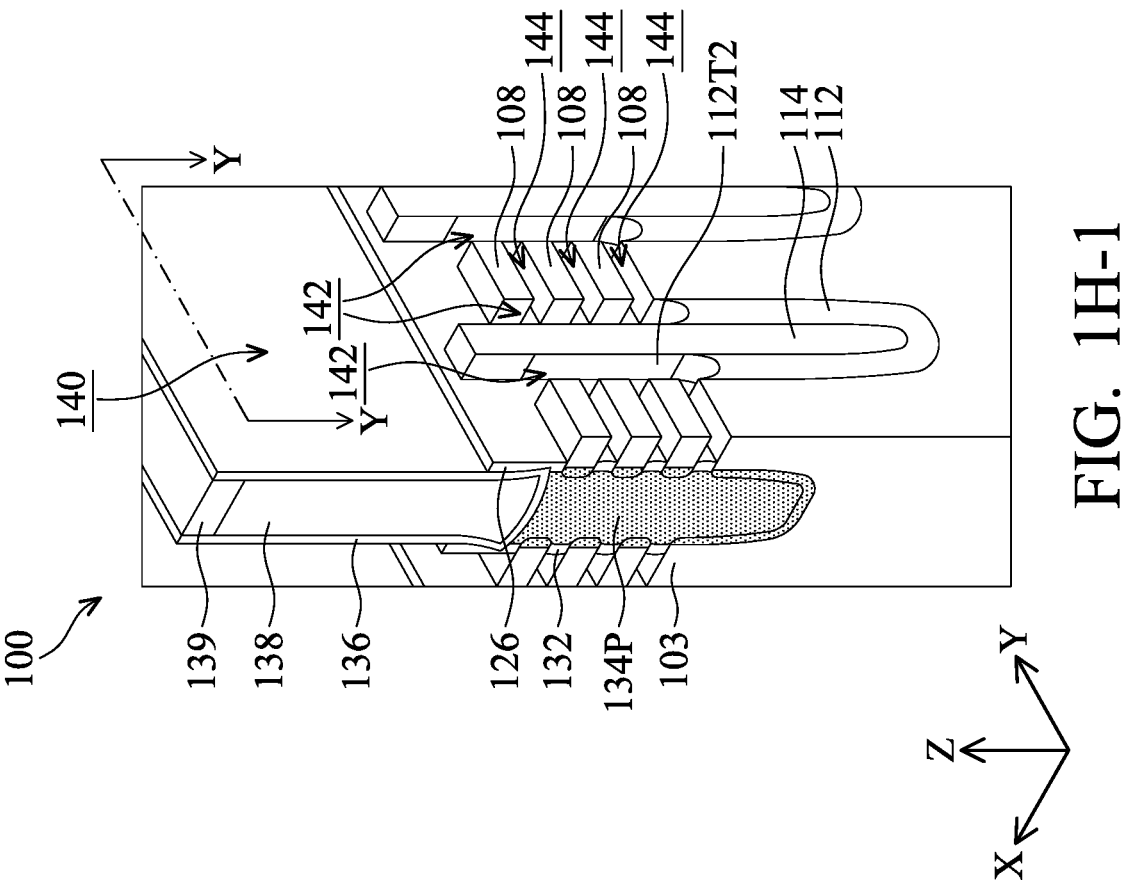

FIG. 1H-1 is a perspective view of a semiconductor structure 100 after the formation of nanostructures, in accordance with some embodiments of the disclosure. FIG. 1H-2 is a cross-sectional view of the semiconductor structure corresponding to line Y-Y of FIG. 1H-1. Line Y-Y is in a plane parallel to the Y direction and through a gate trench 140.

An etching process is performed to remove the first semiconductor layers 106 of the active regions 104 from the recesses 142, thereby forming gaps 144, as shown in FIGS. 1H-1 and 1H-2, in accordance with some embodiments. In some embodiments, the recesses 142 and the gaps 144 are connected to each other and combine to form gate spaces. In some embodiments, the gaps 144 expose the sidewalls of the inner spacer layers 132 facing the channel region. In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

Since the recesses 142 are formed on the opposite two sides of the active regions 104, the etchant can remove the first semiconductor layers 106 from their opposite two sides, which may reduce the difficulty of the etching process and reduce the risk of the damage of the second semiconductor layers 108, in accordance with some embodiments. Therefore, the reliability and manufacturing yield of the resulting semiconductor device may improve. The inner spacer layers 132 may be used as an etching stop layer in the etching process, in accordance with some embodiments. In the etching processes for forming the recesses 142 and the gaps 144, the vertical portions 132A of the inner spacer layers 132 may further block the etchant from damaging the source/drain features 134N and 134P, thereby improving the reliability and manufacturing yield of the resulting semiconductor device.

After the etching process, the four main surfaces of the second semiconductor layers 108 are exposed, in accordance with some embodiments. The exposed second semiconductor layers 108 of the active regions 104 form several sets of nanostructures, in accordance with some embodiments. Within each set, the nanostructures 108 are vertically stacked and spaced apart from one another, in accordance with some embodiments. As the term is used herein, "nanostructures" refers to cylindrical, bar-shaped, and sheet-shaped semiconductor layers. The nanostructures 108 function as channels of the resulting semiconductor device (e.g., nanostructure transistors such as GAA transistors), in accordance with some embodiments.

In some embodiments, the fin spacer layers 112 have recessed upper surfaces 112U2 that are curved (e.g., concave), as shown in FIG. 1H-2. In some embodiments, one end of the recessed upper surface 112U2 jointed with the dielectric wall 114 is higher than the other end of the recessed upper surface 112U2 jointed with the lower fin element 103. In some embodiments, the lowest point 112L of the recessed upper surface 112U2 is located at a lower position than the top surface of the lower fin element 103.

Figure 1I:
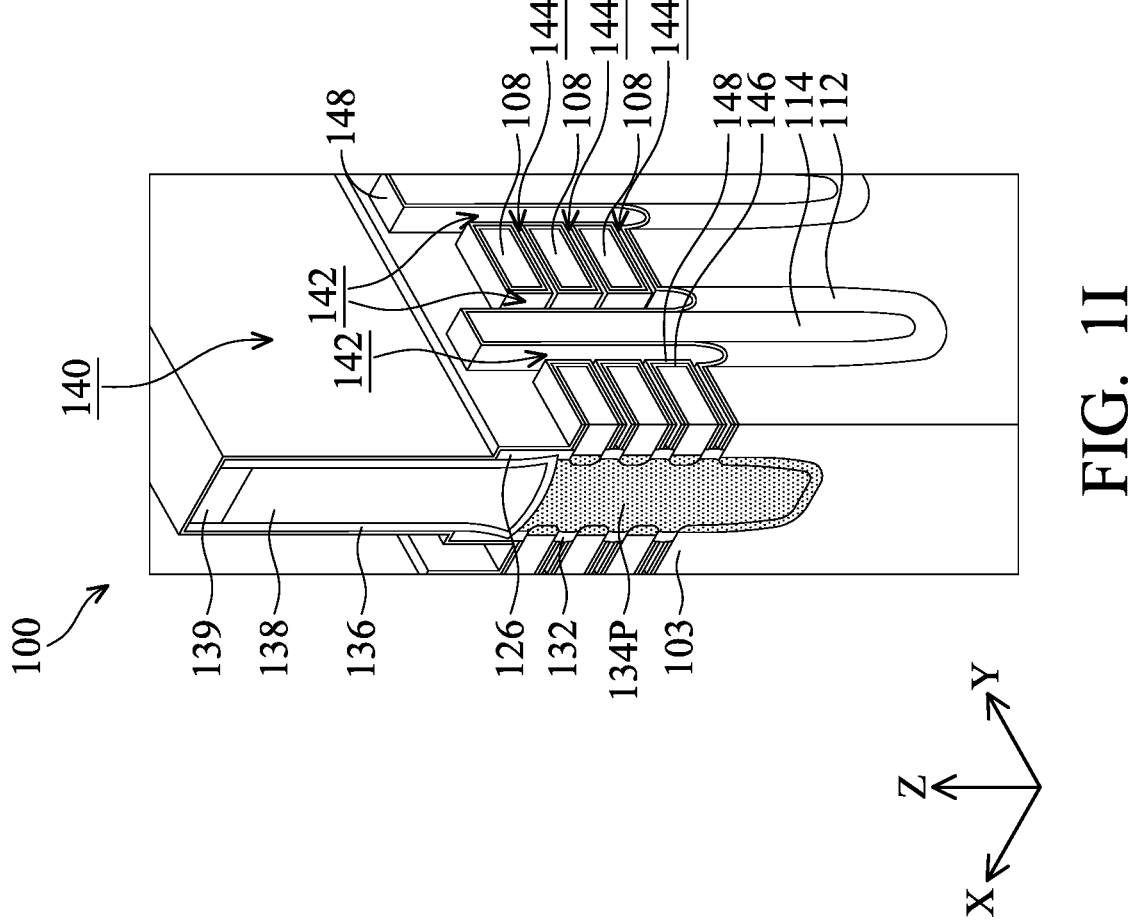
FIG. 1I is a perspective view illustrating of the formation of a semiconductor structure at one of the intermediate stages, in accordance with some embodiments of the disclosure.

FIG. 1I is a perspective view of a semiconductor structure 100 after the formation of the interfacial layer (IL) 146 and gate dielectric layer 148, in accordance with some embodiments of the disclosure. The interfacial layer 146 is formed on the exposed surfaces of the nanostructures 108 and the lower fin element 103, as shown in FIG. 1I, in accordance with some embodiments. The interfacial layer 146 wraps around the nanostructures 108, in accordance with some embodiments. In some embodiments, the interfacial layer 146 is made of a chemically formed silicon oxide. In some embodiments, the interfacial layer 146 is nitrogen-doped silicon oxide. In some embodiments, the interfacial layer 146 is formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 108 and the lower fin elements 103 is oxidized to form the interfacial layer 146, in accordance with some embodiments.

A gate dielectric layer 148 is formed conformally along the interfacial layer 146 to wrap around the nanostructures 108, as shown in FIG. 1I, in accordance with some embodiments. The gate dielectric layer 148 is also conformally formed along the sidewalls of the gate spacers 132 facing the channel region, in accordance with some embodiments. The gate dielectric layer 148 is also conformally formed along the sidewalls of the inner spacer layers 132 facing the channel region, in accordance with some embodiments. The gate dielectric layer 148 is further formed along, and covers, the recessed upper surfaces 112U2 of the fin spacer layers 112 and the top surfaces and the sidewalls of the dielectric walls 114, in accordance with some embodiments.

The gate dielectric layer 148 may be high-k dielectric layer. In some embodiments, the high-k dielectric layer is dielectric material with high dielectric constant (k value), for example, greater than 9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, $Al_2O_3$, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr) $TiO_3$ (BST), $Si_3N_4$, oxynitrides (SiON), a combination thereof, or another suitable material. The high-k dielectric layer may be deposited using ALD, PVD, CVD, and/or another suitable technique.

Figures 1, 1J:
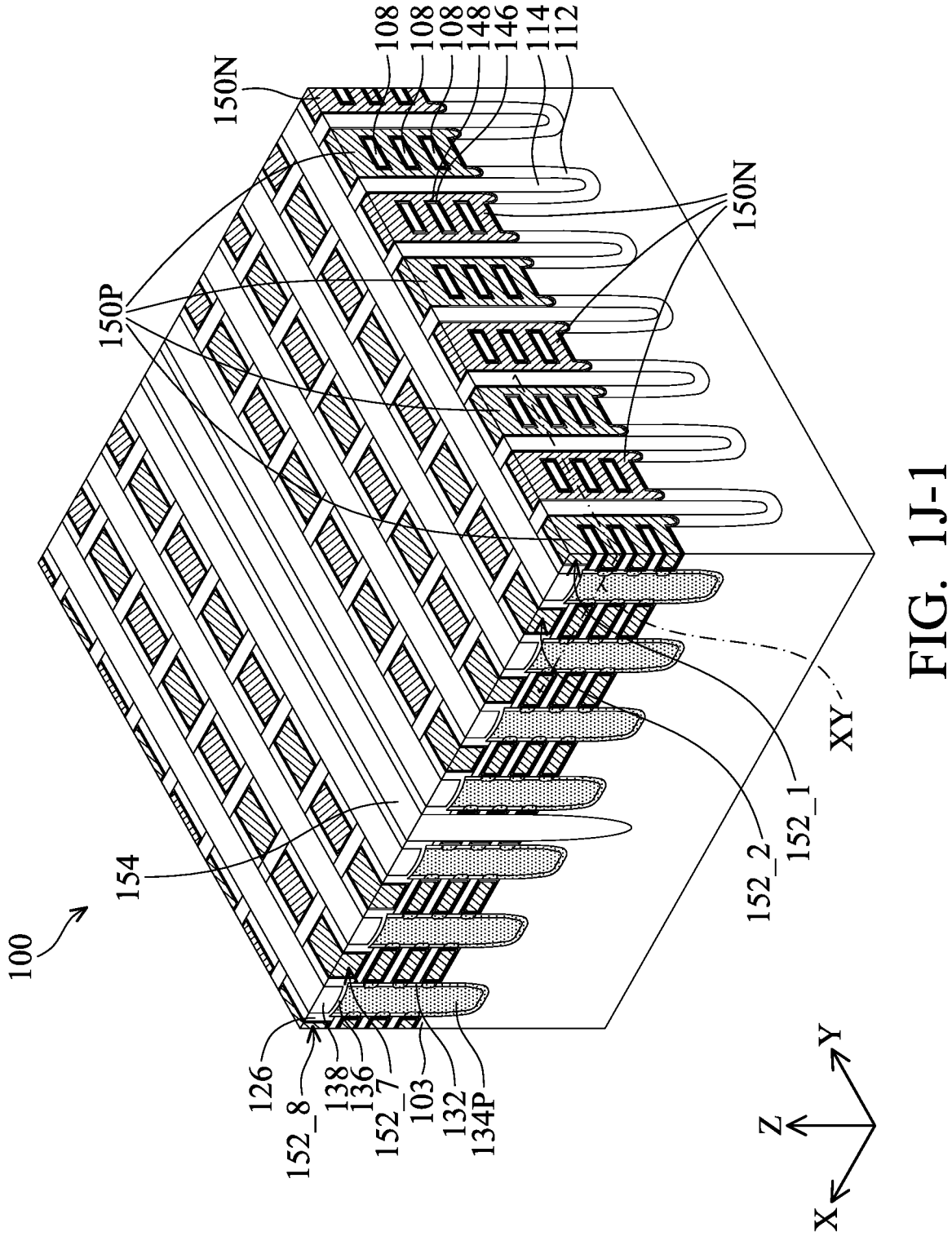
Figures 1, 1J, 2:
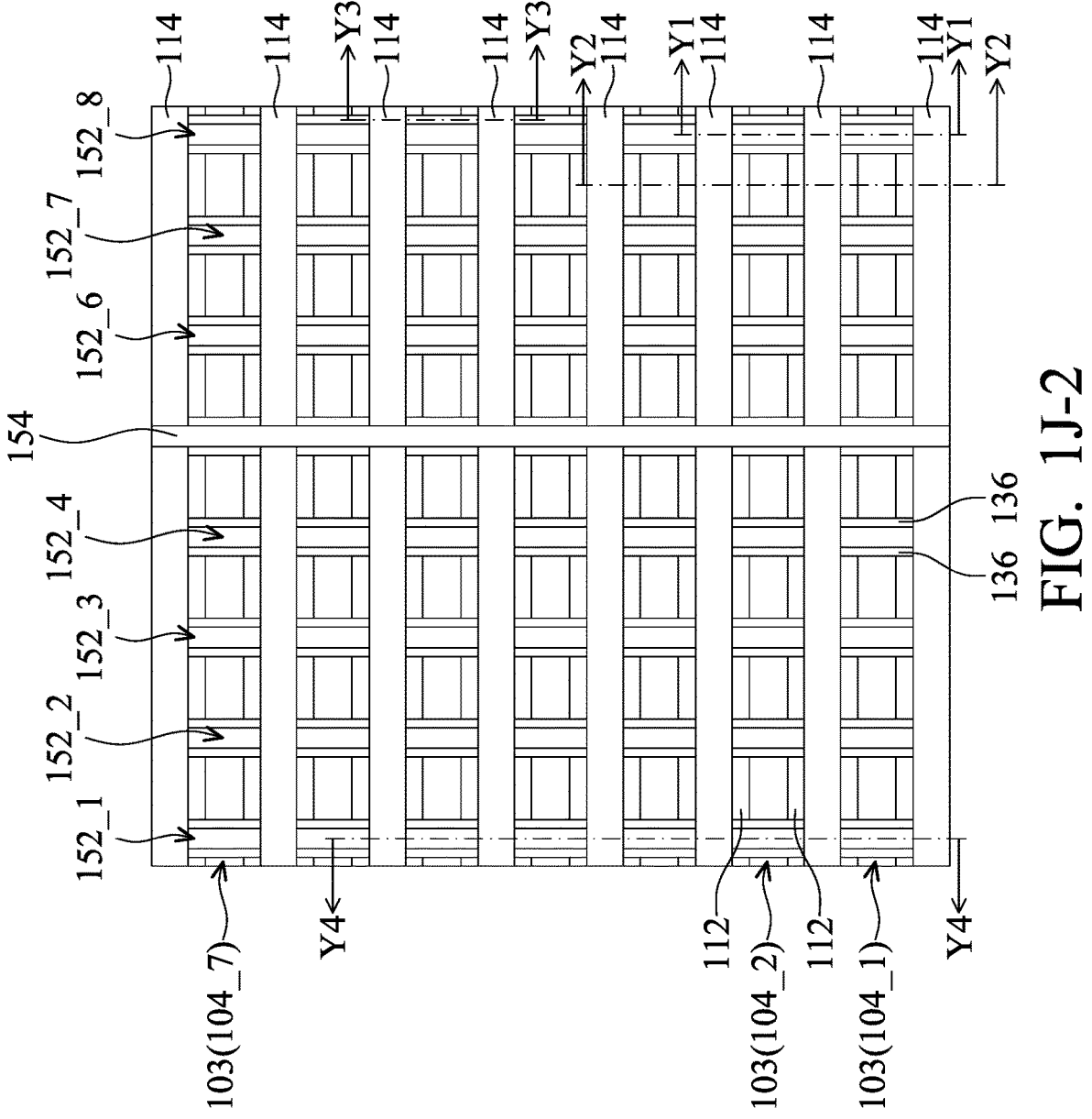

FIG. 1J-1 is a perspective view of a semiconductor structure 100 after the formation of metal gate electrode layers 150N and 150P and an isolation structure 154, in accordance with some embodiments of the disclosure. FIG. 1J-2 is a top view illustrating of the semiconductor structure of FIG. 1J-1. It should be noted that the top view only illustrates some components of the semiconductor structure 100 for illustrative purposes, some other components of the semiconductor structure 100 may be shown in other schematic views. FIGS. 1J-3, 1J-4 and 1J-5 are cross-sectional views of the semiconductor structure 100 corresponding to line Y1-Y1, line Y2-Y2 and line Y3-Y3 of FIG. 1J-2. Line Y1-Y1 is in a plane parallel to the Y direction and through a final gate sack 152. Line Y2-Y2 is in a plane parallel to the Y direction and across source/drain regions. Line Y3-Y3 is in a plane parallel to the Y direction and through a gate spacer layer 126.

The metal gate electrode layers 150N and 150P are formed over the gate dielectric layer 148 to fill remainders of the gate spaces (including recesses 142 and the gaps 144), as shown in FIGS. 1I and 1I-3, in accordance with some embodiments. The metal gate electrode layers 150N are formed over the p-type wells, and the metal gate electrode layers 150P are formed over the n-type well, in accordance with some embodiments. In some embodiments, the metal gate electrode layers 150N and 150P are made of more than one conductive material, such as a metal, metal alloy, conductive metal oxide and/or metal nitride, another suitable conductive material, and/or a combination thereof. For example, the metal gate electrode layers 150N and 150P may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

Since the recesses 142 are formed on the opposite two sides of the active regions 104, the conductive material can fill the gaps 144 from two sides, which may reduce the difficulty of the deposition process and reduce the risk of the formation of voids within the conductive material, in accordance with some embodiments. Therefore, the reliability and manufacturing yield of the resulting semiconductor device may improve.

The metal gate electrode layers 150N and 150P may be a multi-layer structure with various combinations of a diffusion barrier layer, work function layers with a selected work function to enhance the device performance (e.g., threshold voltage) for n-channel FETs and p-channel FETs, a capping layer to prevent oxidation of work function layers, a glue layer to adhere work function layers to a next layer, and a metal fill layer to reduce the total resistance of gate stacks, and/or another suitable layer. The metal gate electrode layers 150N and 150P may be formed using ALD, PVD, CVD, e-beam evaporation, or another suitable technique. The metal gate electrode layers 150N and 150P may be formed separately for n-channel FETs and p-channel FETs, which may use different work function materials. In alternative embodiments, the conductive material for the metal gate electrode layers 150N is the same as the conductive material for the metal gate electrode 150P.

A planarization process such as CMP may be performed on the semiconductor structure 100 to remove the gate dielectric layer 148, the metal gate electrode layers 150N and 150P, the contact etching stop layer 136, the dielectric capping layer 139 until the dielectric walls 114 and the first interlayer dielectric layer 138 are exposed, in accordance with some embodiments. After the planarization process, each of the metal gate electrode layers 150N and 150P is sandwiched between the adjacent dielectric walls 114, and spaced apart from one another, in accordance with some. The top surfaces of the metal gate electrode layers 150N and 150P, the dielectric walls 114 and the first interlayer dielectric layer 138 are substantially coplanar. As a result, the dimension (e.g., width) of the metal gate electrode layers 150N and 150P in the Y direction can be controlled by adjusted the width of the dielectric wall 114. As a result, the metal gate electrode layers having a lower width may be obtained. The metal gate electrode layers having a lower width may reduce the parasitic capacitance (e.g., Cgs and Cgd), thereby improving the performance of the resulting semiconductor device, e.g., speed.

In some embodiments, the interfacial layer 146, the gate dielectric layer 148 and the metal gate electrode layers 150N and 150P combine to form final gate stacks 152 (e.g., including 152_1 to 152_8), as shown in FIGS. 1J-1 and 1J-2, in accordance with some embodiments. It should be noted that one final gate stack (e.g., 152_5) is replaced with an isolation structure 154, which is described later. The final gate stacks 152_1 to 152_8 extend in the Y direction and wrap around multiple sets of the nanostructures 108, in accordance with some embodiments. Each of the final gate stacks 152_1 to 152_8 is divided by the dielectric walls 114 into several segments which electrically isolated from one another, in accordance with some embodiments.

Cutting the final gate stacks 152 into several segments without forming additional cutting structures can omit one patterning process (including a photolithography process and an etching process) for cutting the final gate stacks, which may facilitate the scaling down of the cell height of the semiconductor device, and reduce the loss of work function material of the metal gate electrode layers 150N and 150P, in accordance with some embodiments.

The final gate stacks 152 engage the channel regions so that current can flow between the source/drain features 134N and between the source/drain features 134P during operation, in accordance with some embodiments. Each segment of the final gate stacks 152 combines with the neighboring source/drain features 134N/134P to form nanostructure transistors, e.g., n-channel nanostructure transistors in the p-type wells and p-channel nanostructure transistors in the n-type wells.

In some embodiments, the recesses 142 (FIG. 1H-2) are deeper than the top surfaces of the lower fin elements 103, and thus the final gate stack 152 may have better gate control over the channels of the planar transistors formed from the lower fin elements 103, which may improve the performance of the resulting semiconductor device, e.g., reducing off-state current, DIBL (drain-induced barrier lowering), etc.

One of the final gate stacks (e.g., 152_5) is removed and replaced with an isolation structure 154, as shown in FIGS. 1J-1 and 1J-2, in accordance with some embodiments. The isolation structure 154 extends in the Y direction, in accordance with some embodiments. In some embodiments, the isolation structure 154 is made of dielectric material such as silicon oxide ($SiO_2$), silicon nitride (SiN), silicon oxynitride (SiON), and/or another suitable material. The formation of the isolation structure 154 includes patenting the final gate stack 152_5, the dielectric walls 114, the fin spacer layers 112 and nanostructures 108 using photolithography and etching processes to form a trench, in accordance with some embodiments. The trench may extend into the lower fin element 103 and the substrate 102, in some embodiments. Dielectric material for the isolation structure 154 is formed in the trench using deposition and planarization processes. The cutting structures 154 may be also referred to as cut metal on an oxide definition edge (CMODE) pattern.

FIG. 1J-6 illustrates the semiconductor structure 100 of FIG. 1J-1 cut along plan XY of FIG. 1J-1, in accordance with some embodiments of the disclosure. Each of the segments of the final gate stacks 152 is formed in the space defined by the inner spacer layers 132 and the dielectric walls 114, in accordance with some embodiments. In some embodiments, the inner spacer layer 132 has a dimension D1 in the Y direction that is greater than the width (e.g., W3 and W4) of the upper portion 134U of the source/drain features 134N (or 134P).

Figures 1, 1J, 2, 3, 4:
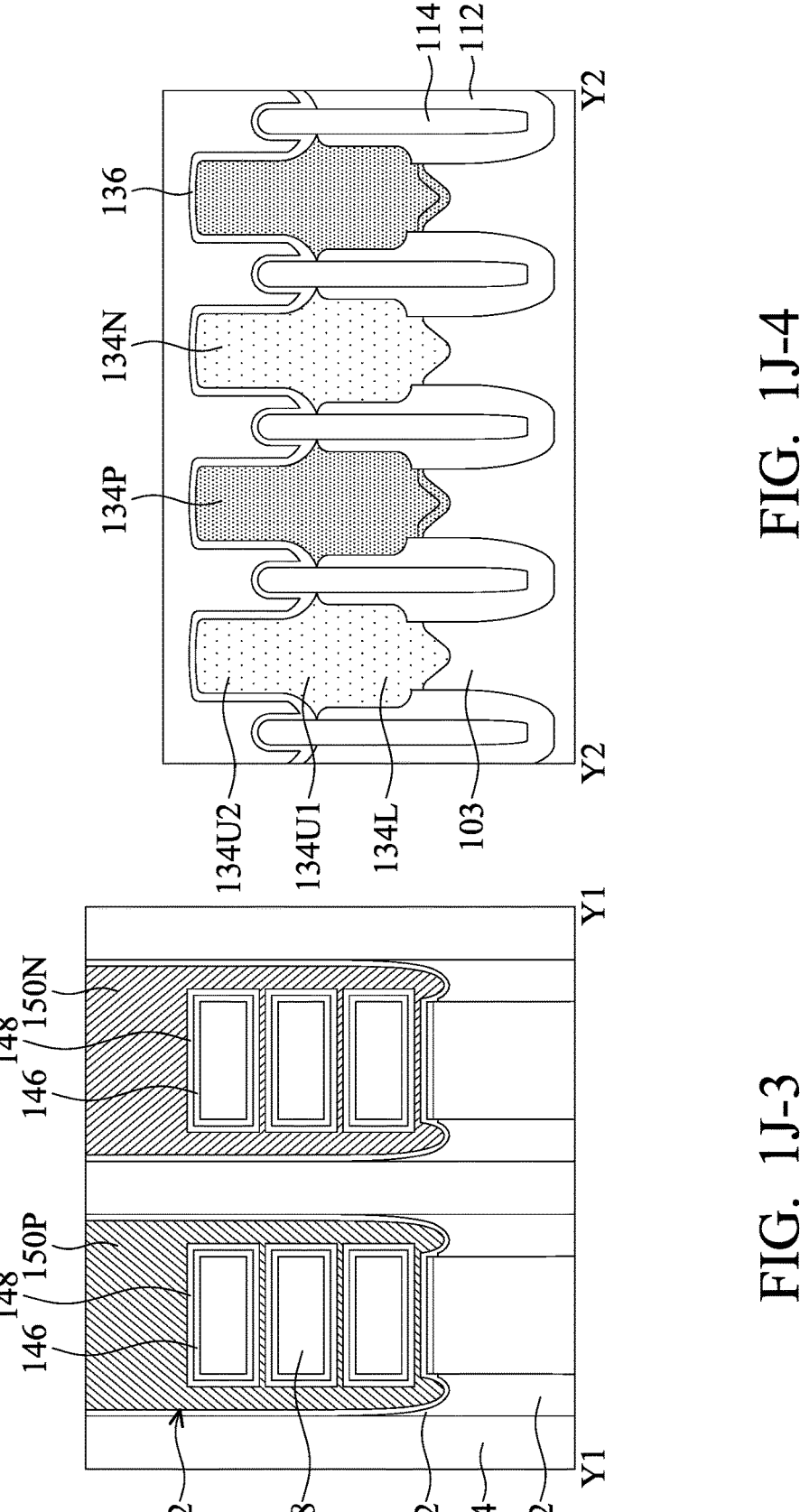
Figures 1, 1J, 2, 3, 4, 5:
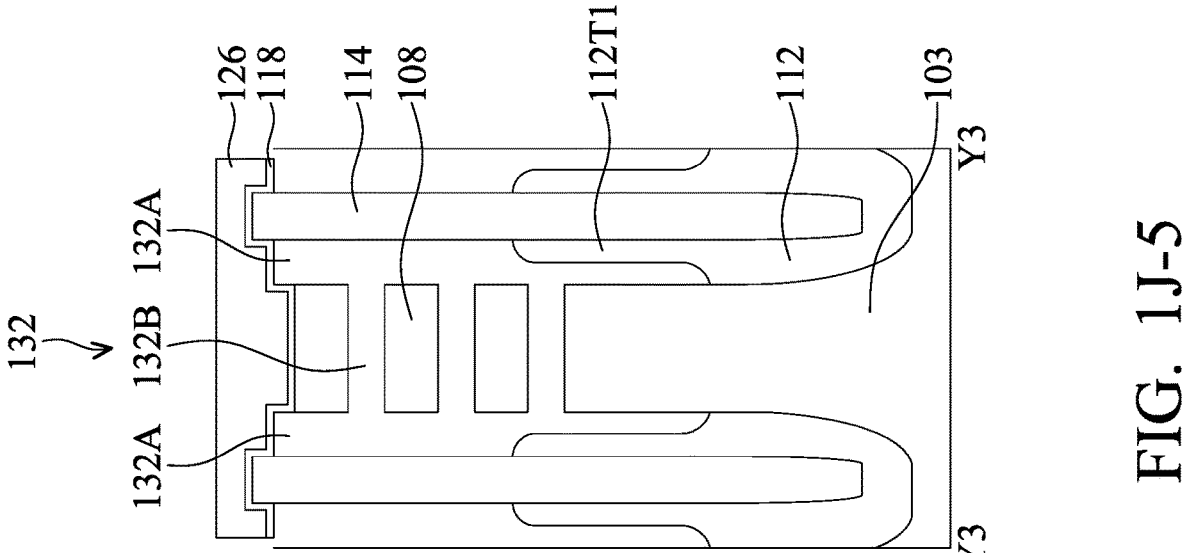
Figures 1, 1J, 2, 3, 4, 5, 6:
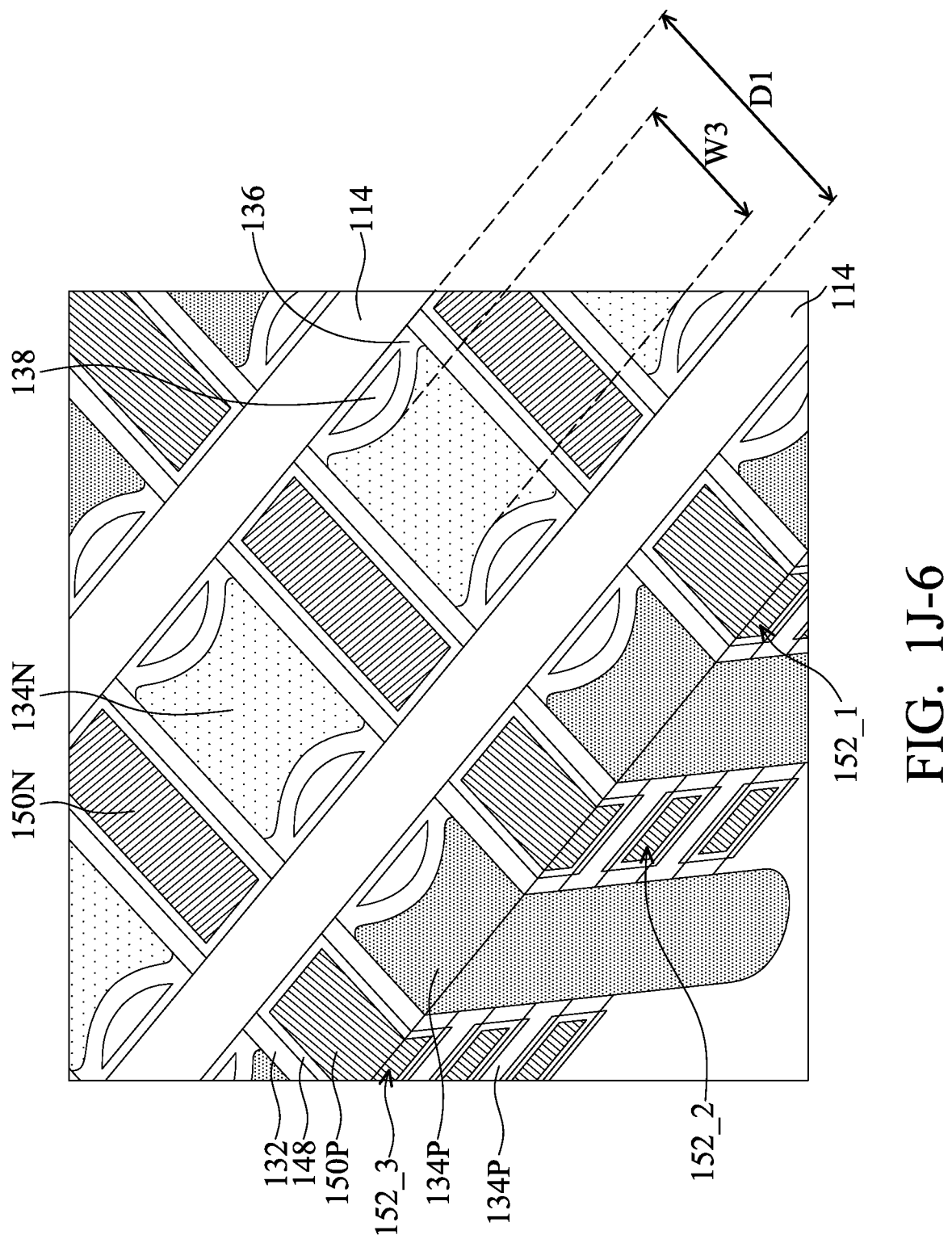
Figures 1K, 1L:
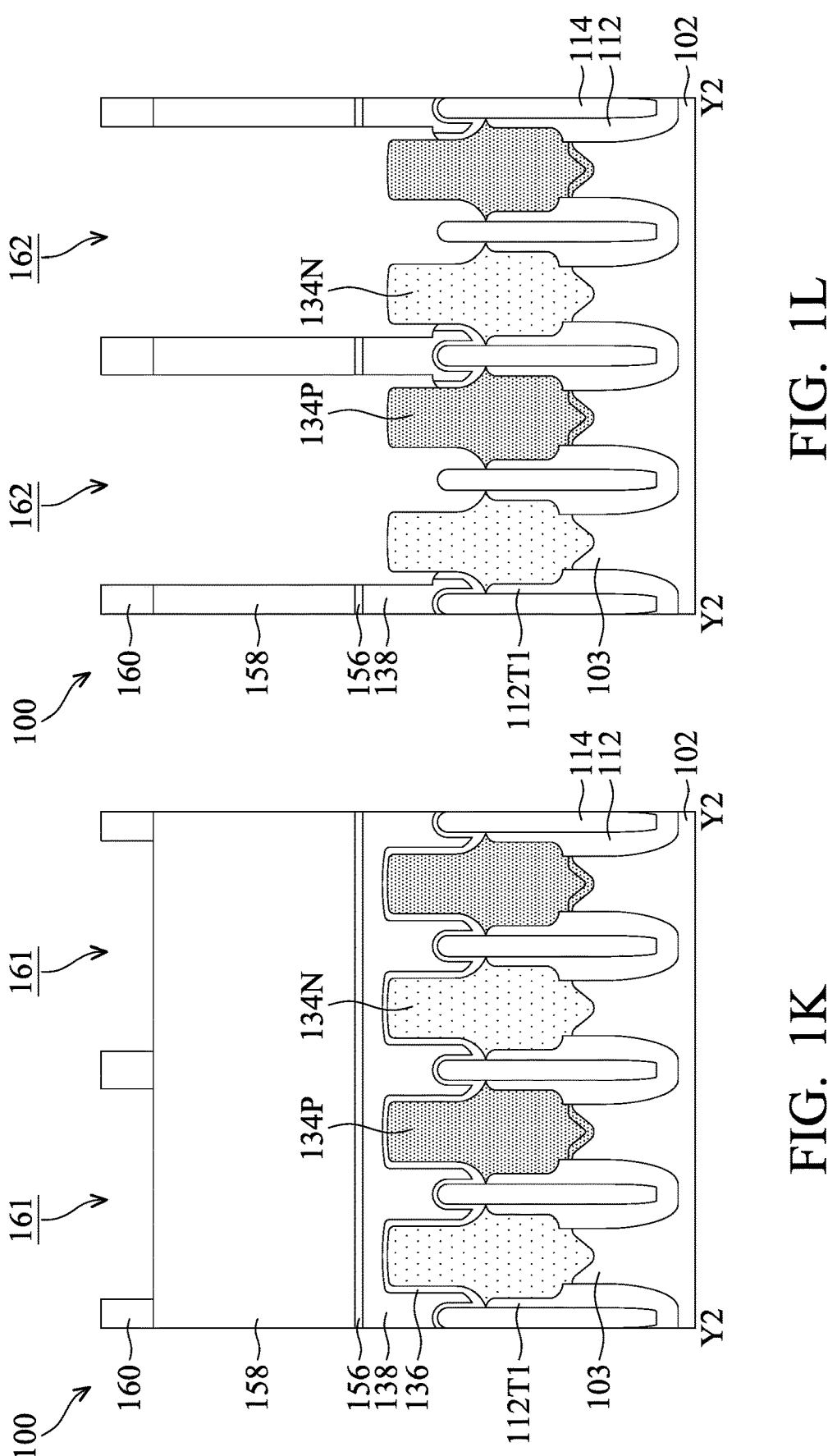
FIG. 1K is a cross-sectional view illustrating of the formation of a semiconductor structure corresponding to line Y2-Y2 of FIG. 1J-2 at one of the intermediate stages, in accordance with some embodiments of the disclosure.
FIG. 1L is a cross-sectional view illustrating of the formation of a semiconductor structure corresponding to line Y2-Y2 of FIG. 1J-2 at one of the intermediate stages, in accordance with some embodiments of the disclosure.

FIG. 1K is a cross-sectional view of a semiconductor structure 100 corresponding to line Y2-Y2 of FIG. 1J-2 after the formation of an etching stop layer 156, a second interlayer dielectric layer 158 and a patterned mask layer 160, in accordance with some embodiments of the disclosure. An etching stop layer 156 is formed over the semiconductor structure 100, as shown in FIG. 1K, in accordance with some embodiments. In some embodiments, the etching stop layer 156 is made of dielectric material, such as silicon nitride (SiN), silicon oxynitride (SiON), silicon oxide ($SiO_2$), silicon carbide (SiC), oxygen-doped silicon carbide (SiC:O), oxygen-doped silicon carbonitride (Si(O)CN), or a combination thereof. In some embodiments, a dielectric material for the etching stop layer 156 is deposited using CVD (such as LPCVD, PECVD, HDP-CVD, or HARP), ALD, another suitable method, or a combination thereof.

A second interlayer dielectric layer 158 is formed over the etching stop layer 156, as shown in FIG. 1K, in accordance with some embodiments. In some embodiments, the second interlayer dielectric layer 158 is made of dielectric material, such as USG, BPSG, FSG, PSG, BSG, or another suitable dielectric material. In some embodiments, the second interlayer dielectric layer 158 and etching stop layer 156 are made of different materials and have a great difference in etching selectivity. In some embodiments, the second interlayer dielectric layer 158 is deposited using CVD (such as HDP-CVD, PECVD, HARP or FCVD), another suitable technique, or a combination thereof.

A patterned mask layer 160 is formed over the second interlayer dielectric layer 158, as shown in FIG. 1K, in accordance with some embodiments. The patterned mask layer 160 is a patterned photoresist layer, a patterned hard mask layer, and/or a combination thereof, in accordance with some embodiments. In some embodiments, a photoresist is formed using spin-on coating, and then patterned with opening patterns 161 by exposing the photoresist to light using an appropriate photomask. Exposed or unexposed portions of the photoresist may be removed depending on whether a positive or negative resist is used. In some embodiments, the opening patterns 161 are formed directly above the source/drain features 134N and 134P, as shown in FIG. 1K, in accordance with some embodiments. Although FIG. 1K illustrates one opening pattern 161 corresponds to two source/drain features 134N and 134P, the one opening pattern 135 may correspond to one source/drain features 134N or 134P, or more than two source/drain features 134N and/or 134P.

In alternative embodiments, a hard mask layer may be formed on semiconductor structure 100. The hard mask layer may include, or be formed of, a nitrogen-free anti-reflection layer (NFARL), carbon-doped silicon dioxide (e.g., $SiO_2$:C), titanium nitride (TiN), titanium oxide (TiO), boron nitride (BN), a multilayer thereof, another suitable material, and/or a combination thereof. The hard mask layer may be etched using a patterned photoresist layer, which may be formed by the photolithography described above, thereby having the opening patterns 161.

FIG. 1L is a cross-sectional view illustrating a semiconductor structure 100 corresponding to line Y2-Y2 of FIG. 1J-2 after an etching process, in accordance with some embodiments of the disclosure. In some embodiments, an etching process is performed on the semiconductor structure 100 using the patterned mask layer 160 to form contact openings 162 through the second interlayer dielectric layer 158, the etching top layer 156, the first interlayer dielectric layer 138 and the contact etching top layer 136, as shown in FIG. 1L, in accordance with some embodiments. The etching process may be an anisotropic etching process such as dry plasma etching, an isotropic etching process such as dry chemical etching, remote plasma etching or wet chemical etching, and/or a combination thereof. The etching process is performed until the source/drain features 134N and 134P are exposed, in accordance with some embodiments.

In some embodiments, the dielectric walls 114 are also exposed from the contact openings 162 and recessed. In some embodiments, the tailing portions 112T1 of the fin spacer layers remain covered by the source/drain feature 134N and/or 134P and are not etched in the etching process.

Figure 1M:
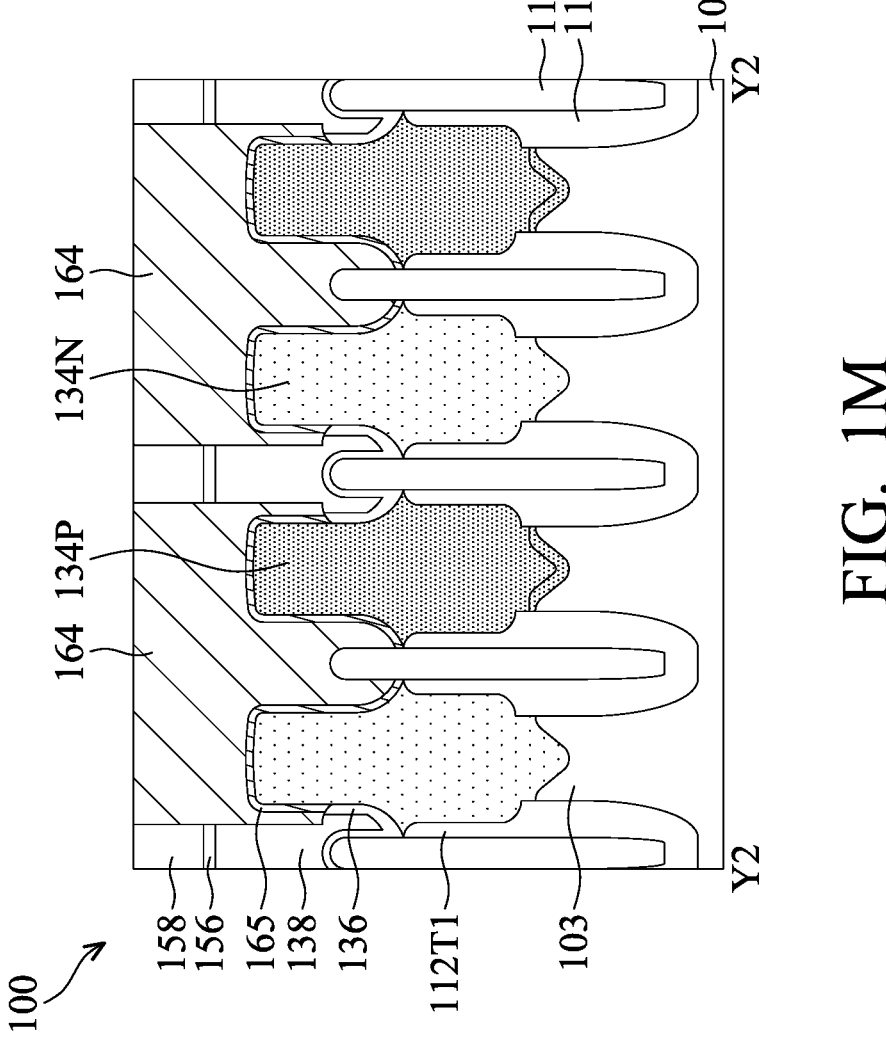
FIG. 1M is a cross-sectional view illustrating of the formation of a semiconductor structure corresponding to line Y2-Y2 of FIG. 1J-2 at one of the intermediate stages, in accordance with some embodiments of the disclosure.

FIG. 1M is a cross-sectional view illustrating a semiconductor structure 100 corresponding to line Y2-Y2 of FIG. 1J-2 after the formation of the contact plugs 164, in accordance with some embodiments of the disclosure. Contact plugs 164 are formed in the contact openings 162 and land on the source/drain features 134N and 134P, as shown in FIG. 1M, in accordance with some embodiments. The contact plugs 164 are electrically connected to the source/drain features 134N and 134P, in accordance with some embodiments.

In some embodiments, the formation of the contact plugs 164 includes forming a silicide layer 165 (such as WSi, NiSi, TiSi and/or CoSi) on the exposed surfaces of the source/drain features 134N and 134P, depositing one or more conductive materials over the silicide layer to fill the contact openings 162, and planarizing the one or more conductive materials until the top surface of the second interlayer dielectric layer 158 is exposed using, for example, CMP. In some embodiments, the conductive material is deposited using CVD, PVD, e-beam evaporation, ALD, electroplating (ECP), electroless deposition (ELD), another suitable method, or a combination thereof. After the planarization process, the top surfaces of the contact plugs 164 and the second interlayer dielectric layer 158 are substantially coplanar, in accordance with some embodiments.

The contact plugs 164 may have a multilayer structure including, for example, liner layers, glue layers, barrier layers, seed layers, metal bulk layers, another suitable layer, or a combination thereof. For example, a barrier/adhesive layer (not shown) may optionally be deposited along the sidewalls and the bottom surfaces of the contact openings 162. A metal bulk layer is then deposited on the barrier/adhesive layer (if formed) to fill the remainder of the contact openings. The barrier/adhesive layer is used to prevent the metal from the subsequently formed metal material from diffusing into the dielectric material (e.g., the interlayer dielectric layers 158 and 138, and the etching stop layers 156 and 136), and/or to improve adhesion between the subsequently formed metal bulk material and the dielectric materials. The barrier/adhesive layer may be made of tantalum (Ta), tantalum nitride (TaN), titanium (Ti), titanium nitride (TiN), cobalt tungsten (CoW), another suitable material, or a combination thereof. If the subsequently formed metal material does not easily diffuse into the dielectric material, the barrier layer may be omitted.

In some embodiments, the metal bulk layer is formed using a selective deposition technique such as cyclic CVD process or ELD process, and it is not necessary to form a glue layer in the contact openings 162 before depositing the metal bulk material. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

Figure 1N:
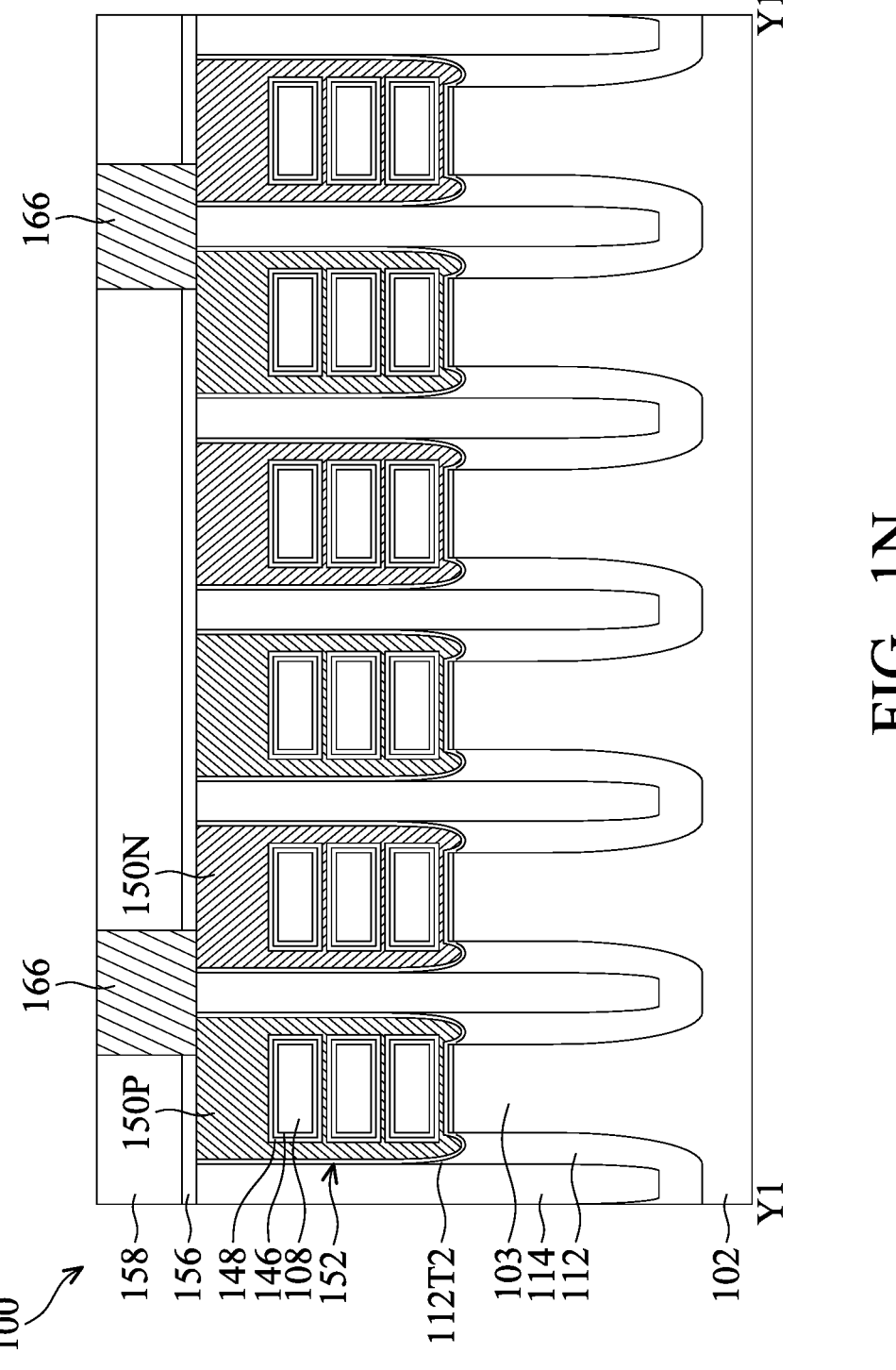
FIG. 1N is a cross-sectional view illustrating of the formation of a semiconductor structure corresponding to line Y4-Y4 of FIG. 1J-2 at one of the intermediate stages, in accordance with some embodiments of the disclosure.
Figures 1, 10:
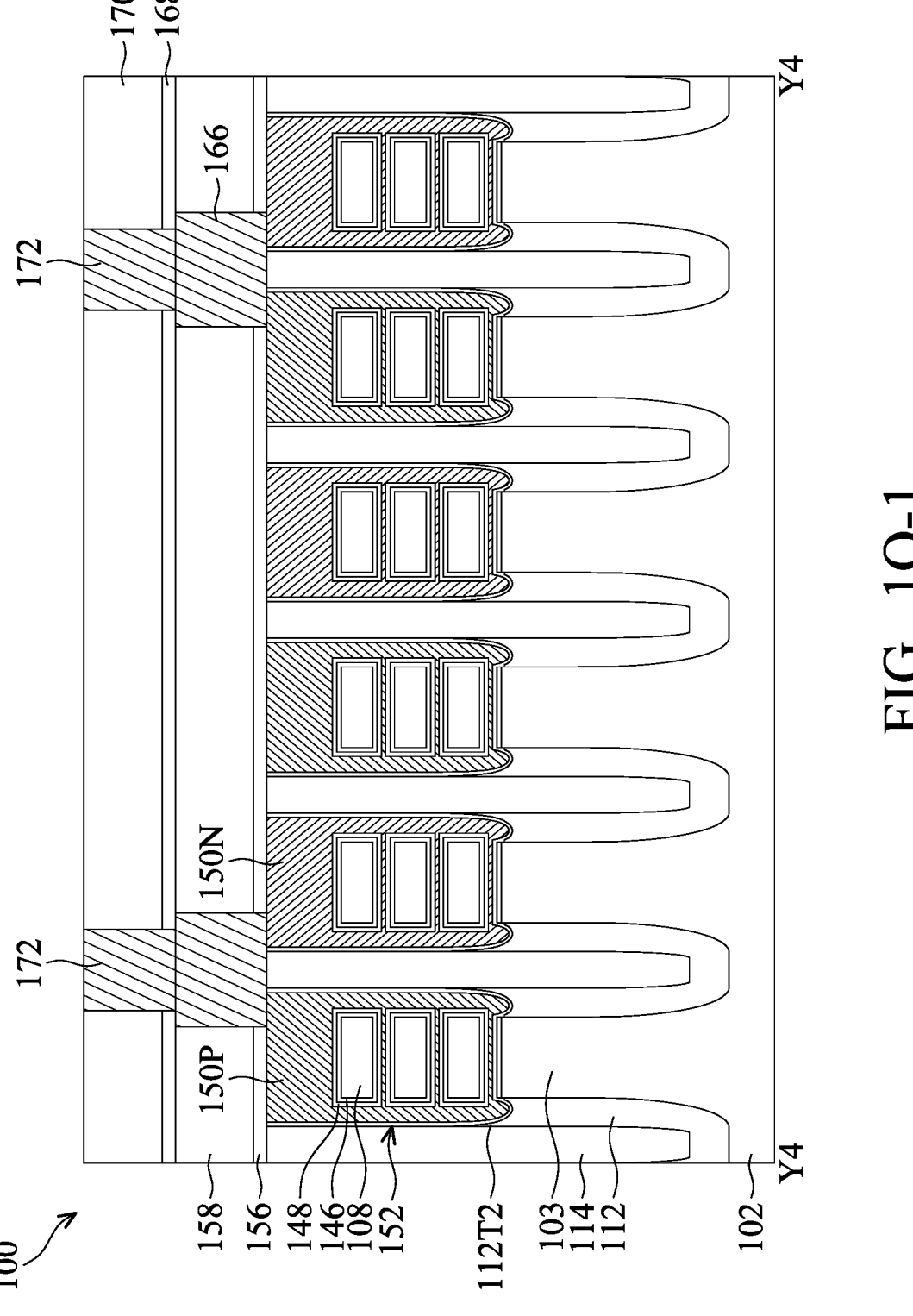
Figures 2, 10:
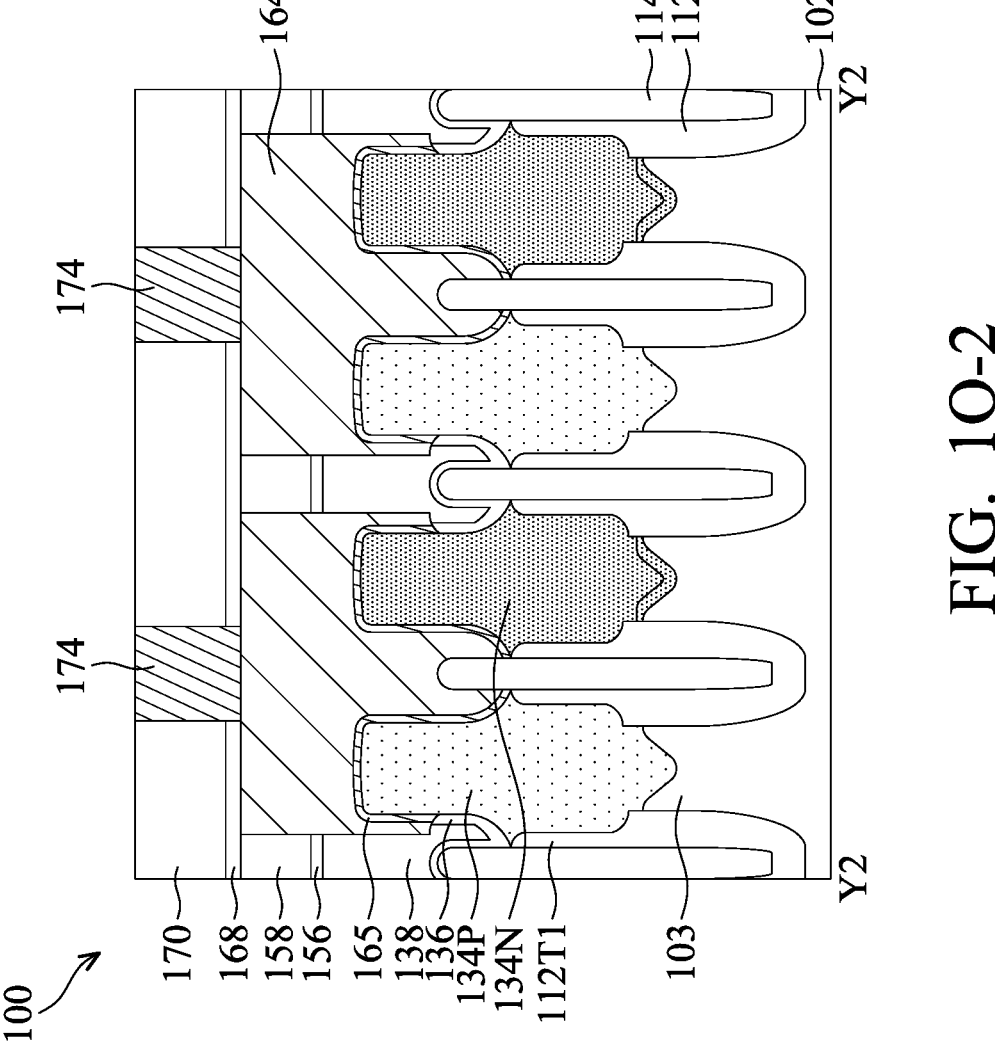
Figure 2:
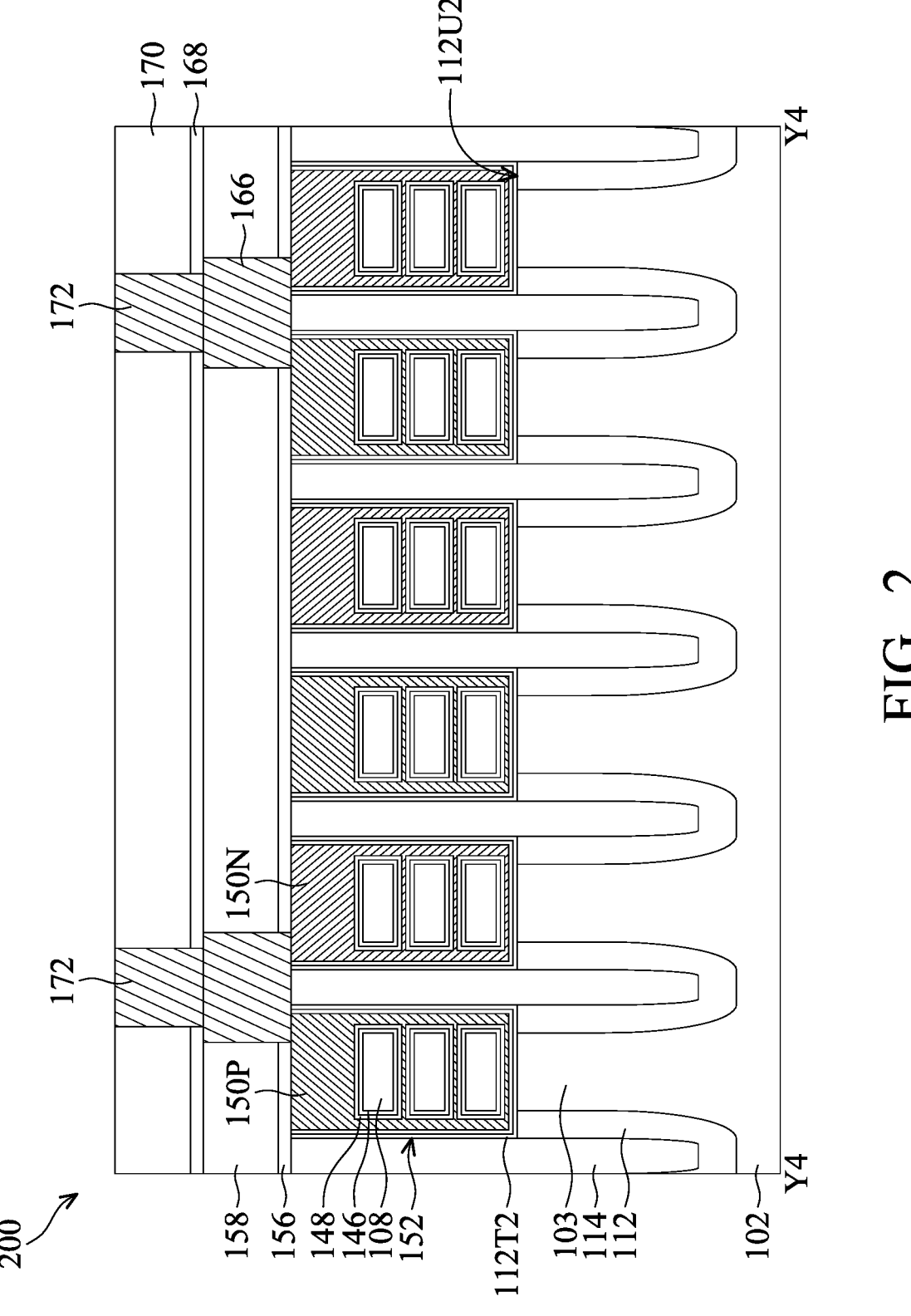
Figure 3:
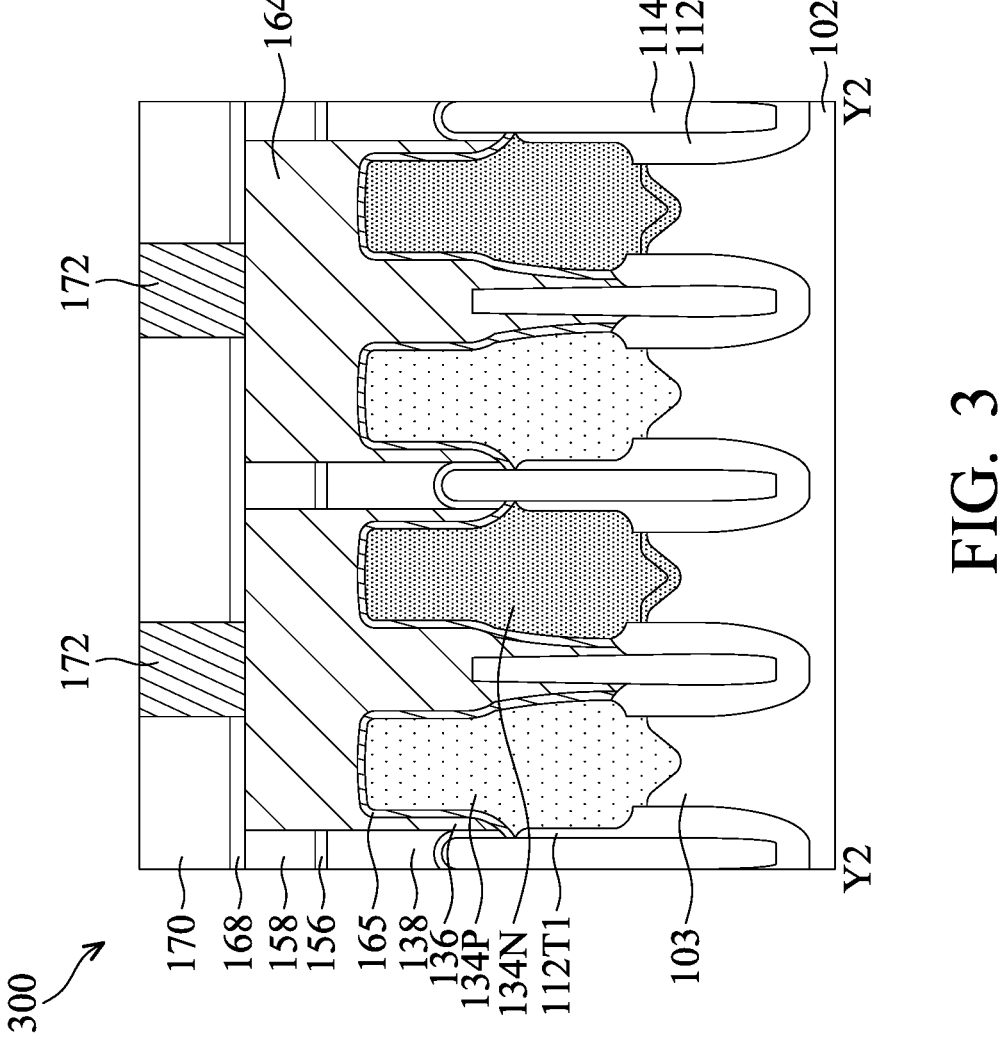
Figure 4:
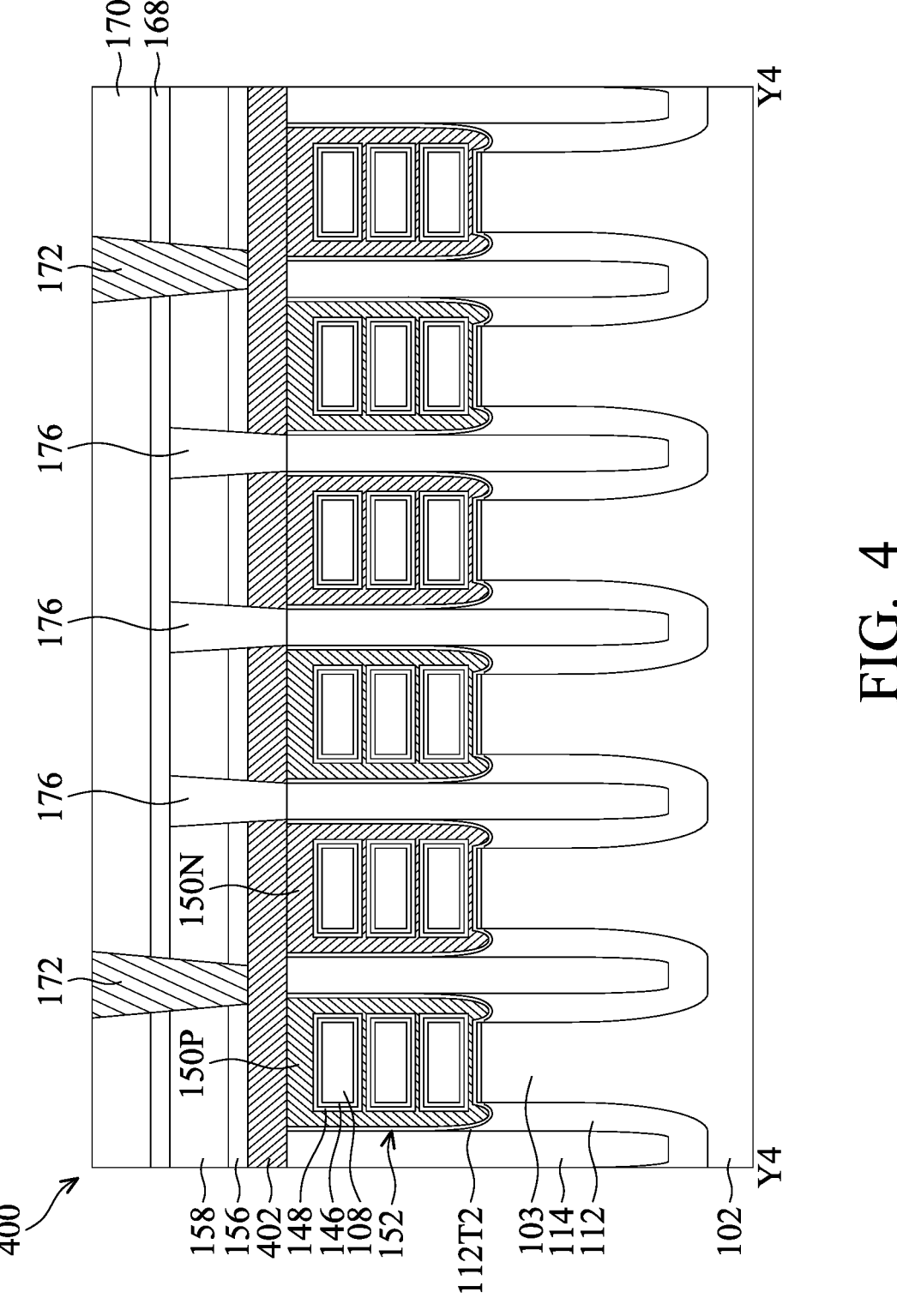

FIG. 1N is a cross-sectional view illustrating a semiconductor structure 100 corresponding to line Y4-Y4 of FIG. 1J-2 after the formation of gate connection structures 166, in accordance with some embodiments of the disclosure. Gate connection structures 166 are formed in and/or through the second interlayer dielectric layer 158 and the etching stop layer 156 and land on the metal gate electrode layers 150N and 150P of the final gate stacks 152, as shown in FIG. 1N, in accordance with some embodiments. One gate connection structure 166 is electrically connected to the two adjacent segments (e.g., respective including the gate electrode layers 150N and 150P) of one final gate stack 152, as shown in FIG. 1N, in accordance with some embodiments. The number and the electrically conductive type of the segments of the final gate stacks 152 connected by one gate connection structure 166 may be dependent on the demands on the design of the semiconductor device and/or performance considerations. In some embodiments, the gate connection structures 166 extends across the dielectric walls 114. In some embodiments, the gate connection structures 166 are in direct contact with the dielectric walls 114 and the metal gate electrode layers 150N and 150P of the final gate stacks 152.

In some embodiments, the formation of the gate connection structures 166 includes patterning the second interlayer dielectric layer 158 and the etching stop layer 156 to form openings (where the gate connection structures 166 are to be formed) using photolithography and etching processes until the final gate stacks 152 are exposed. In some embodiments, the formation of the gate connection structures 166 further includes depositing one or more conductive materials over the semiconductor structure 100 to fill the contact openings, and planarizing the one or more conductive materials until the top surface of the second interlayer dielectric layer 158 is exposed using, for example, CMP. In some embodiments, the conductive material is deposited using CVD, PVD, e-beam evaporation, ALD, ECP, ELD, another suitable method, or a combination thereof. After the planarization process, the top surfaces of the gate connection structures 166, the second interlayer dielectric layer 158, and the contact plugs 164 are substantially coplanar, in accordance with some embodiments.

The gate connection structures 166 may have a multilayer structure. For example, a barrier/adhesive layer (not shown) may optionally be deposited along the sidewalls and the bottom surfaces of the openings for the gate connection structures 166. A metal bulk layer is then deposited on the barrier/adhesive layer (if formed) to fill the remainder of the openings. The barrier/adhesive layer may be made of tantalum (Ta), tantalum nitride (TaN), titanium (Ti), titanium nitride (TiN), cobalt tungsten (CoW), another suitable material, or a combination thereof. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

FIGS. 1O-1 and 1O-2 are cross-sectional views illustrating a semiconductor structure 100 corresponding to line Y4-Y4 and line Y2-Y2 of FIG. 1J-2 after the formation of an etching stop layer 168, a third interlayer dielectric layer 170 and vias 172 and 174, in accordance with some embodiments of the disclosure. An etching stop layer 168 is formed over the semiconductor structure 100, as shown in FIGS. 1O-1 and 1O-2, in accordance with some embodiments. In some embodiments, the etching stop layer 168 is made of dielectric material, such as silicon nitride (SiN), silicon oxynitride (SiON), silicon oxide (SiO$_2$), silicon carbide (SiC), oxygen-doped silicon carbide (SiC:O), oxygen-doped silicon carbonitride (Si(O)CN), or a combination thereof. In some embodiments, a dielectric material for the etching stop layer 168 is deposited using CVD (such as LPCVD, PECVD, HDP-CVD, or HARP), ALD, another suitable method, or a combination thereof.

A third interlayer dielectric layer 170 is formed over the etching stop layer 168, as shown in FIGS. 1O-1 and 1O-2, in accordance with some embodiments. In some embodiments, the third interlayer dielectric layer 170 is made of dielectric material, such as USG, BPSG, FSG, PSG, BSG, or another suitable dielectric material. In some embodiments, the third interlayer dielectric layer 170 and etching stop layer 168 are made of different materials and have a great difference in etching selectivity. In some embodiments, the third interlayer dielectric layer 170 is deposited using CVD (such as HDP-CVD, PECVD, HARP or FCVD), another suitable technique, or a combination thereof.

Vias 172 are formed in and/or through the third interlayer dielectric layer 170 and the etching stop layer 168 and land on gate connection structure 166, and vias 174 are formed in and/or through the third interlayer dielectric layer 170 and land on the contact plugs 164, as shown in FIGS. 1O-1 and 1O-2, in accordance with some embodiments. The vias 172 are electrically connected to the metal gate electrode layers 150N and 150P of the final gate stacks 152 through gate connection structures 166 and may be also referred to as gate vias (VG), in accordance with some embodiments. The vias 174 are electrically connected to source/drain features 134N and 134P through the contact plugs 164 and may be also referred to as source/drain vias (VS or VD), in accordance with some embodiments.

In some embodiments, the formation of the vias 172 and vias 174 includes patterning the third interlayer dielectric layer 170 and the etching stop layer 168 to form via openings (where the vias 172 and vias 174 are to be formed) using photolithography and etching processes. In some embodiments, the gate connection structures 166 are exposed from the via openings for vias 172, and the contact plugs 164 are exposed from the via openings for vias 174. The etch processes may include dry etching such as reactive ion etch (RIE), neutral beam etch (NBE), inductive coupled plasma (ICP) etch, capacitively coupled plasma (CCP) etch, another suitable method, or a combination thereof. In some embodiments, the patterning processes for the vias 172 and vias 174 may be formed separately.

Afterward, one or more conductive materials are deposited using CVD, PVD, e-beam evaporation, ALD, ECP, ELD, another suitable method, or a combination thereof to overfill the via openings, in accordance with some embodiments. The one or more conductive materials over the upper surface of the third interlayer dielectric layer 170 are planarized using, for example, CMP. After the planarization process, the top surfaces of the vias 172, vias 174, and the third interlayer dielectric layer 170 are substantially coplanar, in accordance with some embodiments.

The vias 172 and vias 174 may have a multilayer structure. For example, a barrier/adhesive layer (not shown) may optionally be deposited along the sidewalls and the bottom surfaces of the via openings for the vias 172 and vias 174. A metal bulk layer is then deposited on the barrier/adhesive layer (if formed) to fill the remainder of the via openings. The barrier/adhesive layer may be made of tantalum (Ta), tantalum nitride (TaN), titanium (Ti), titanium nitride (TiN), cobalt tungsten (CoW), another suitable material, or a combination thereof. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

It should be understood that the semiconductor structure 100 may undergo further CMOS processes to form various features over the frontside of the semiconductor structure 100, such as a multilayer interconnect structure (e.g., metal lines, inter metal dielectric layers, passivation layers, etc.).

FIG. 2 is a modification of the semiconductor structure 100 of FIG. 1O-1, in accordance with some embodiments of the disclosure. FIG. 2 illustrates a semiconductor 200 which is similar to the semiconductor structure 100 of FIGS. 1O-1 except that the fin spacer layers 112 have no tailing portions remaining on the sidewalls of the dielectric walls 114. In some embodiments, the fin spacer layers 112 are recessed to have substantially flat upper surface 112U2 and have no tailing portions remaining on the sidewalls of the dielectric walls 114, as shown in FIG. 2. In some embodiments, the substantially flat upper surface 112U2 of the fin spacer layers 112 is located at a position the substantially levels with the top surfaces of the lower fin elements 103. FIG. 3 is a modification of the semiconductor structure of FIG. 1O-2, in accordance with some embodiments of the disclosure. FIG. 3 illustrates a semiconductor 300 which is similar to the semiconductor structure 100 of FIGS. 1O-1 except for the depths of the contact plugs 164. In the etching process for forming the contact openings 162 (FIG. 1/L), the tailing portions 112T1 of the fin spacer layers 112 at the center of the contact openings 162 are also removed, as shown in FIG. 3, in accordance with some embodiments. In some embodiments, the lower portions 134L of the source/drain feature 134N and 134P at the center of the contact openings 162 are also partially removed. As a result, the contact area between the source/drain feature 134N (and/or 134P) and the contact plugs 164 may increase, thereby enhancing the performance of the resulting semiconductor device, e.g., reduction in contact resistance (Rc).

FIG. 4 is a modification of the semiconductor structure of FIG. 1O-1, in accordance with some embodiments of the disclosure. FIG. 4 illustrates a semiconductor 400 which is similar to the semiconductor structure 100 of FIGS. 1O-1 except that the gate stacks 152 are cut by cutting structure 176 into several segments. In some embodiments, the metal gate electrode layers 150N and 150P and the dielectric walls 114 may be partially etched to form recesses, and metal capping layers 402 for the final gate stacks 152 are formed in the recesses and continuously extend over the dielectric walls 114 and the metal gate electrode layer 150N and 150P. In some embodiments, the metal capping layers 402 are made of fluorine-free tungsten (FFW). In alternative embodiments, the dielectric walls 114 are recessed in the etching processes for forming the recessing 142 and/or the gaps 144, and the metal gate electrode layer 150P and/or 150N of the gate stacks 152 continuously extends over the recessed dielectric walls 114.

After the formation of the etching stop layer 156 and the second interlayer dielectric layer 158, gate cutting structures 176 are formed in and/or through the second interlayer dielectric layer 158, the etching stop layer 156 and the metal capping layers 402 of the final gate stacks 152, as shown in FIG. 4, in accordance with some embodiments. In some embodiments, the gate cutting structures 176 land on the dielectric walls 114, in accordance with some embodiments. The final gate stacks 152 are cut by the gate cutting structures 176 into several segments which electrically isolated from one another, in accordance with some embodiments. The gate cutting structures 176 may be also referred to as cut metal gate (CMG) pattern.

In some embodiments, the gate cutting structures 176 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO₂), or a combination thereof. In some embodiments, the gate cutting structures 176 include dielectric material with a k-value greater than 9, such as LaO, AlO, AlON, ZrO, HfO, ZnO, ZrN, ZrAlO, TiO, TaO, YO, and/or TaCN.

The formation of the gate cutting structures 176 includes patterning the second interlayer dielectric layer 158, the etching stop layer 156 and the final gate stacks 152 to form cutting opening (where the gate cutting structures 176 are to be formed) using photolithography and etching processes. The formation of the gate cutting structures 176 further includes depositing a dielectric material for the gate cutting structures 176 to overfill the cutting openings, in accordance with some embodiments. In some embodiments, the deposition process is ALD, CVD (such as LPCVD, PECVD, HDP-CVD, or HARP), another suitable technique, or a combination thereof. Afterward, a planarization process is then performed on the dielectric material for the gate cutting structures 176 until the second interlayer dielectric layer 158 are exposed, in accordance with some embodiments. The planarization may be CMP, an etching back process, or a combination thereof. Since the formation of the dielectric walls 114, the aspect ratio of the cutting openings for the gate cutting structures 176 may be reduced, which may reduce the difficulty of the formation of the cutting openings, in accordance with some embodiments. Therefore, the reliability and manufacturing yield of the resulting semiconductor device may improve.

Figure 5A:
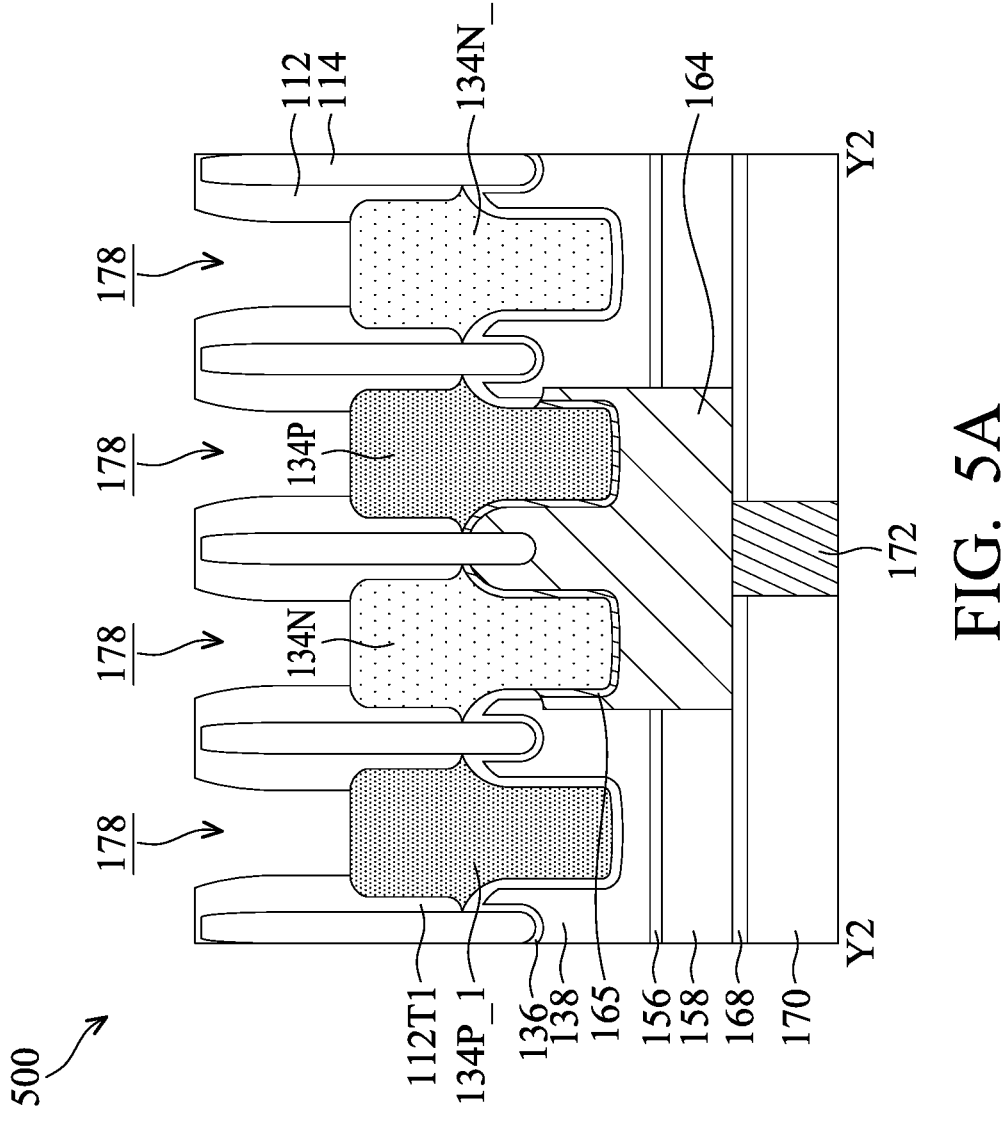
FIG. 5A is a cross-sectional view illustrating of the formation of a semiconductor structure corresponding to line Y2-Y2 of FIG. 1J-2 at one of the intermediate stages, in accordance with some embodiments of the disclosure.
Figure 5B:
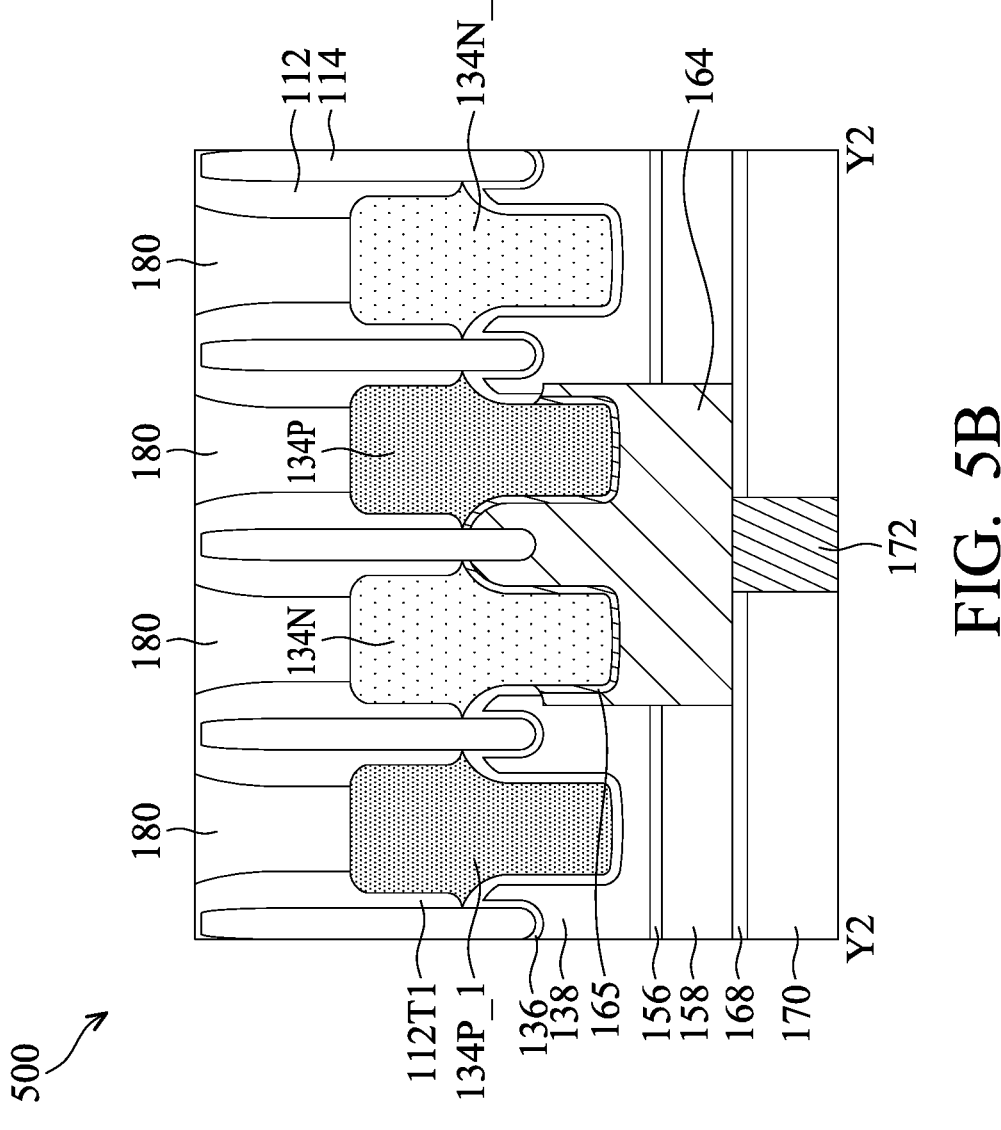
FIG. 5B is a cross-sectional view illustrating of the formation of a semiconductor structure corresponding to line Y2-Y2 of FIG. 1J-2 at one of the intermediate stages, in accordance with some embodiments of the disclosure.
Figure 5C:
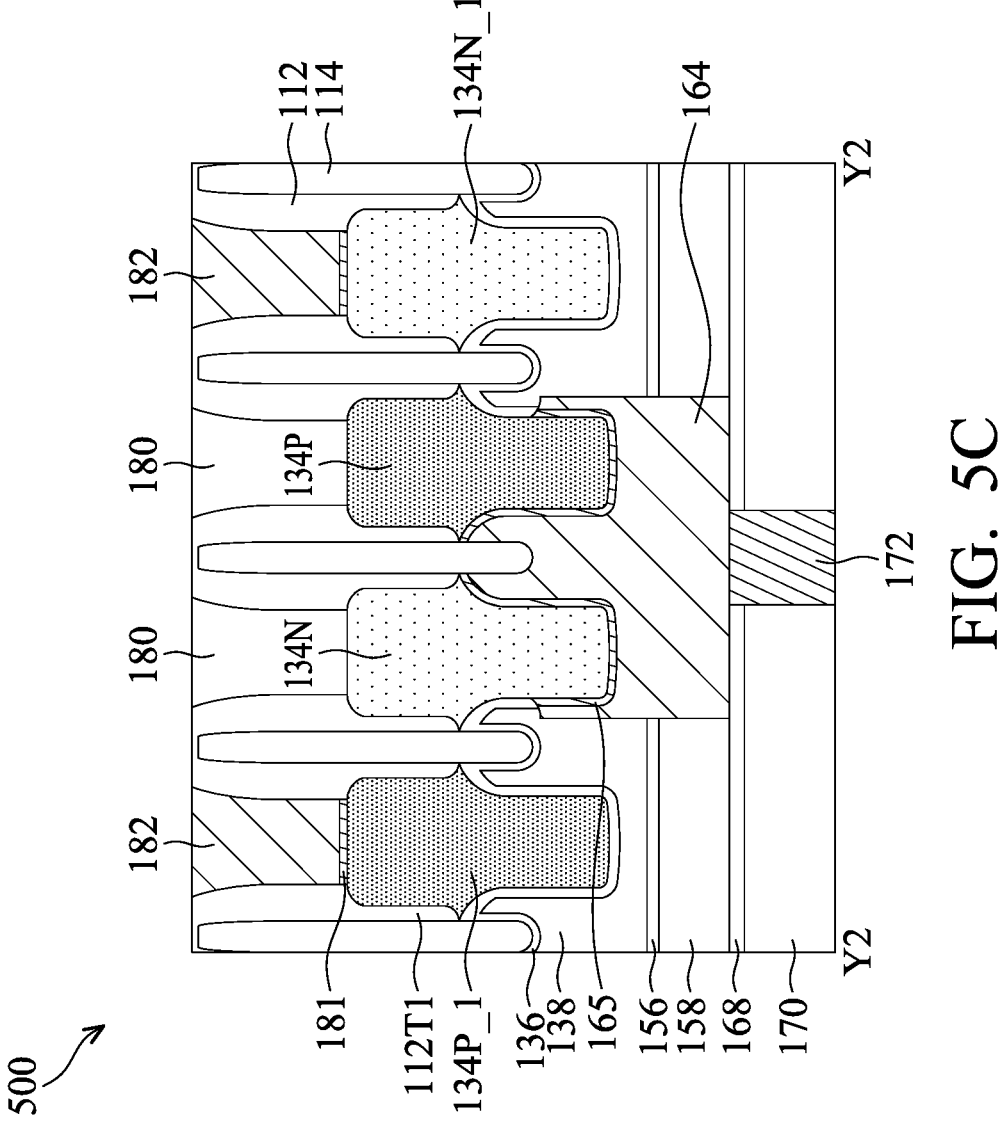
FIG. 5C is a cross-sectional view illustrating of the formation of a semiconductor structure corresponding to line Y2-Y2 of FIG. 1J-2 at one of the intermediate stages, in accordance with some embodiments of the disclosure.
Figure 6:
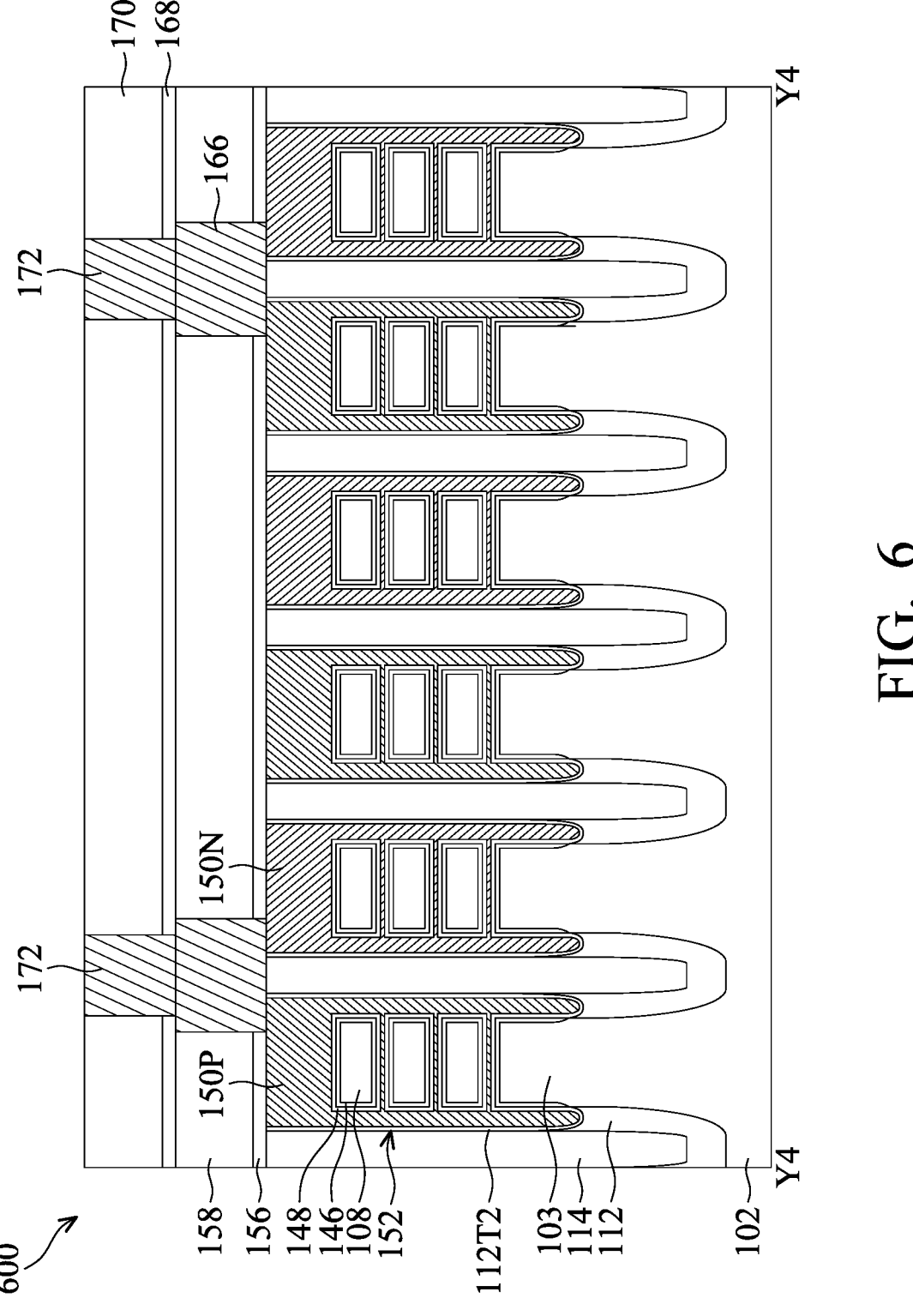

FIGS. 5A through 5C are cross-sectional views illustrating the formation of a semiconductor structure 100 corresponding to line Y2-Y2 of FIG. 1J-2 at various intermediate stages, in accordance with some embodiments of the disclosure. FIG. 5A illustrates a semiconductor structure 500 after the formation of trenches 178 at the backside of the semiconductor structure. The semiconductor structure 500 is similar to the semiconductor structure 100 of FIGS. 1O-1 except no contact plugs formed on source/drain features 134N_1 and 134P_1. In some embodiments, the source/drain features 134N_1 and 134P_1 function as source terminals of the nanostructure transistors.

The semiconductor structure 500 is flipped upside down, as shown FIG. 5A, in accordance with some embodiments. In some embodiments, a carrier substrate (not shown) may be formed over the frontside of the semiconductor structure 500 before flipping the semiconductor structure 500 to protect of components of the semiconductor structure 500 during subsequent backside processes. After flipping the semiconductor structure 500, the backside surface of the substrate 102 faces upward, in accordance with some embodiments.

The substrate 102 is removed from the backside of the substrate 102 using a planarization process such as CMP, etching process, or a combination thereof, and then the lower fin elements 103 are removed using an etching process, thereby forming trenches 178, as shown in FIG. 5A, in accordance with some embodiments. The etching process may be an anisotropic etching process such as dry plasma etching, an isotropic etching process such as dry chemical etching, remote plasma etching or wet chemical etching, and/or a combination thereof. The trenches 178 expose the sidewalls of the fin spacer layers 112 and the upper surfaces of the source/drain features 134N and 134P and the source/drain features 134N_1 and 134P_1, in accordance with some embodiments.

FIG. 5B illustrates a semiconductor structure 500 after the formation of insulating layers 180. Insulating layers 180 are formed in the trenches 178, as shown in FIG. 5B, in accordance with some embodiments. In some embodiments, the insulating layers 180 are made dielectric material such silicon oxide (SiO₂), silicon nitride (SiN), silicon oxynitride (SiON), silicon carbide (SiC), oxygen-doped silicon carbide (SiC:O), oxygen-doped silicon carbonitride (Si(O)CN), or a combination thereof. The formation of the insulating layers 180 includes forming a dielectric material for insulating layers 180 over the backside of the semiconductor structure 500 to overfill the trenches 178, and planarizing the dielectric material using the CMP, etching-back process, or another suitable process until the fin spacer layers 112 are exposed, in accordance with some embodiments. The remaining portions of the dielectric material in the trenches 178 serve as the insulating layers 180, in accordance with some embodiments.

FIG. 5C illustrates a semiconductor structure 500 after the formation of metal lines 182. The insulating layers 180 over the source/drain features 134N_1 and 134P_1 are removed using an etching process, thereby forming trenches again, in accordance with some embodiments. Metal lines 182 are then formed in the trenches, as shown in FIG. 5C, in accordance with some embodiments. The metal lines 182 are electrically connected to the source/drain features 134N_1 and 134P_1, in accordance with some embodiments. In some embodiments, the metal lines 182 are power supply lines which may include a Vdd power rail providing positive voltage and/or a Vss power rail which may be an electrical ground.

In some embodiments, the formation of the metal lines 182 includes forming a silicide layer 181 (such as WSi, NiSi, TiSi and/or CoSi) on the exposed surface of the source/drain features 134N_1 and 134P_1, depositing one or more conductive materials over the silicide layer 181 to fill the trenches, and planarizing the one or more conductive materials until the top surface of the fin spacer layers 112 are exposed using, for example, CMP. In some embodiments, the conductive material is deposited using CVD, PVD, e-beam evaporation, ALD, ECP, ELD, another suitable method, or a combination thereof.

The metal lines 182 may have a multilayer structure. For example, a barrier/adhesive layer (not shown) may optionally be deposited along the sidewalls and the bottom surfaces of the trenches for the metal lines 182. A metal bulk layer is then deposited on the barrier/adhesive layer (if formed) to fill the remainder of the trenches. The barrier/adhesive layer may be made of tantalum (Ta), tantalum nitride (TaN), titanium (Ti), titanium nitride (TiN), cobalt tungsten (CoW), another suitable material, or a combination thereof. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

FIG. 6 is a modification of the semiconductor structure 100 of FIG. 1O-1, in accordance with some embodiments of the disclosure. FIG. 6 illustrates a semiconductor 600 which is similar to the semiconductor structure 100 of FIGS. 1O-1 except for the depths of the final gate stacks 152. The recess 142 (FIG. 1G) may extend to a middle height of the lower fin elements 103, in accordance with some embodiments. The final gate stacks 152 extend between the dielectric walls 114 and the lower fin elements 103, as shown in FIG. 6, in accordance with some embodiments. Therefore, the final gate stacks 152 may have better gate control over the channels of the FinFETs formed from the lower fin elements 103, which may improve the performance of the resulting semiconductor device, e.g., reducing off-state current, DIBL, etc.

As described above, the aspect of the present disclosure is directed to a semiconductor structure including nanostructure transistors. The semiconductor structure 100 includes sets of nanostructures 108, the final gate stack 152 surrounding the sets of nanostructures 108, and the dielectric walls 114 cutting the final gate stack 152 into segments that are electrically isolated from one another, in accordance with some embodiments. Because the dielectric walls 114 are formed self-aligned between the active regions 104, the final gate stack 152 is cut by the dielectric walls 114 without forming additional cutting structures. Therefore, it may facilitate the scaling down of the cell height of the resulting semiconductor device.

In addition, the formation of the semiconductor structure 100 includes forming fin spacer layers 112 alongside the active regions 104, in accordance with some embodiments. The presence of the fin spacer layers 112 may provide more space for the etchant to laterally etch the epitaxial source/drain features 134N/134P, which may help in shaping the source/drain features to have the desired profile. Therefore, the performance of the resulting semiconductor device may improve.

In addition, the semiconductor structure 100 includes inner spacer layers 132 with H-shaped or stair-shaped profiles, which are formed by laterally recessing the fin spacer layers 112, in accordance with some embodiments. The vertical portions 132A of the inner spacer layers 132 may further block the etchant from damaging the source/drain features 134N/134P during the etching process for forming the nanostructures. Therefore, the reliability and manufacturing yield of the resulting semiconductor device may improve.

Embodiments of a semiconductor structure and a method for forming the semiconductor structure are provided. The method may include forming fin spacer layers along sidewalls of an active region, forming dielectric walls over the fin spacer layers, laterally etching the first semiconductor layers of the active region and the fin spacer layers to form a notch, and forming an inner spacer layer in the notch. The inner spacer includes vertical portions and horizontal portions connecting the vertical portions, and thus the inner spacer may protect the source/drain features from damage in the etching process for forming the nanostructures. Therefore, the reliability and manufacturing yield of the resulting semiconductor device may improve.

In some embodiments, a method for forming a semiconductor structure is provided. The method includes forming an active region which includes a lower fin element, over which a stack of alternating first semiconductor layers and second semiconductor layers is disposed. The method also includes forming a fin spacer layer along a sidewall of the active region, forming a dielectric wall over the fin spacer layer, forming a dummy gate structure over the active region, the fin spacer layer, and the dielectric wall, and etching the active region, the fin spacer layer, and the first dielectric wall to form a first recess. The method also includes laterally recessing, from the first recess, the first semiconductor layers of the active region and the fin spacer layer to form a notch, forming an inner spacer layer in the notch, and forming a source/drain feature on the lower fin element of the active region.

In some embodiments, a method for forming a semiconductor structure is provided. The method includes forming a plurality of active regions over a substrate, forming a plurality of fin spacer layers between the active regions, and forming a plurality of dielectric walls nested within the respective fin spacer layers. The method also includes forming a dummy gate structure over the active regions, the fin spacer layers, and the dielectric walls. Interfaces between the dummy gate structure and the fin spacer layers are higher than interfaces between the dummy gate structure and the active regions. The method also includes removing the dummy gate structure. The method also includes recessing the fin spacer layers to expose the sidewalls of the active regions. The method also includes patterning the active regions to form sets of nanostructures. The method also includes forming a gate stack around the sets of nanostructures.

In some embodiments, a semiconductor structure is provided. The semiconductor structure includes a first dielectric wall, a first set of nanostructures and a second dielectric wall, a first gate electrode layer, a source/drain feature, and an inner spacer layer. The first dielectric wall, the first set of nanostructures, and the second dielectric wall are sequentially arranged in a first horizontal direction. The first gate electrode layer is wrapped around the first set of nanostructures. The source/drain feature is adjoining the first set of nanostructures. The source/drain feature is sandwiched between the first dielectric wall and the second dielectric wall. The inner spacer layer is interposed between the first gate electrode layer and the source/drain feature, as well as between the first set of nanostructures. In a plan view, a first dimension of the inner spacer layer in the first horizontal direction is greater than a second dimension of the source/drain feature in the first horizontal direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming an active region which includes a lower fin element and first semiconductor layers and second semiconductor layers alternately stacked over the lower fin element;
   forming a fin spacer layer along a sidewall of the active region;
   forming a dielectric wall over the fin spacer layer;
   forming a dummy gate structure over the active region, the fin spacer layer and the dielectric wall;
   etching the active region, the fin spacer layer and the first dielectric wall to form a first recess;
   laterally recessing, from the first recess, the first semiconductor layers of the active region and the fin spacer layer to form a notch;
   forming an inner spacer layer in the notch; and
   forming a source/drain feature on the lower fin element of the active region.

2. The method for forming the semiconductor structure as claimed in claim 1, wherein the notch includes:
   a vertical portion exposing a sidewall of the dielectric wall and sidewalls of the second semiconductor layers; and
   horizontal portions exposing top and bottom surfaces of the second semiconductor layers.

3. The method for forming the semiconductor structure as claimed in claim 1, wherein forming the source/drain feature comprises a deposition-etching-deposition process.

4. The method for forming the semiconductor structure as claimed in claim 1, further comprising:
   forming an interlayer dielectric layer over the source/drain feature, wherein a portion of the interlayer dielectric layer extends between the source/drain feature and the dielectric wall.

5. The method for forming the semiconductor structure as claimed in claim 1, wherein the active region, the fin spacer layer, and the first dielectric wall extend in a first horizontal direction, and in a plan view, the inner spacer layer extends beyond an edge of the source/drain feature in a second horizontal direction perpendicular to the first horizontal direction.

6. The method for forming the semiconductor structure as claimed in claim 1, further comprising:
   removing the dummy gate structure to form a trench;
   recessing a portion of the fin spacer layer exposed from the trench to form a second recess; and
   etching, from the second recess, the first semiconductor layers of the active region to form a plurality of gaps.

7. The method for forming the semiconductor structure as claimed in claim 6, wherein the second recess is deeper than a top surface of the lower fin element.

8. The method for forming the semiconductor structure as claimed in claim 6, further comprising:
   forming a gate stack in the plurality of gaps and the second recess; and
   planarizing the gate stack until a top surface of the dielectric wall is exposed.

9. The method for forming the semiconductor structure as claimed in claim 1, further comprising:
   forming a contact plug on a top surface of the source/drain feature, wherein the contact plug is in direct contact with the dielectric wall.

10. The method for forming the semiconductor structure as claimed in claim 1, further comprising:
   removing the lower fin element to expose a bottom surface of the source/drain feature; and
   forming a conductive line on the bottom surface of the source/drain feature, wherein the conductive line is spaced apart from the dielectric wall by the fin spacer layer.

11. A method for forming a semiconductor structure, comprising:
   forming a plurality of active regions over a substrate;
   forming a plurality of fin spacer layers between the plurality of active regions;
   forming a plurality of dielectric walls nested within the respective fin spacer layers of the plurality of fin spacer layers;
   forming a dummy gate structure over the plurality of active regions, the plurality of fin spacer layers, and the plurality of dielectric walls, wherein interfaces between the dummy gate structure and the plurality of fin spacer layers are higher than interfaces between the dummy gate structure and the plurality of active regions;
   removing the dummy gate structure;
   recessing the plurality of fin spacer layers to expose sidewalls of the plurality of active regions;
   patterning the plurality of active regions to form sets of nanostructures; and
   forming a gate stack around the sets of nanostructures.

12. The method for forming the semiconductor structure as claimed in claim 11, wherein the gate stack includes a first gate electrode layer surrounding a first set of nanostructures of the sets of nanostructures and a second gate electrode layer surrounding a second set of nanostructures of the sets of nanostructures, wherein the first gate electrode layer is separated from the second gate electrode layer by a first dielectric wall of the plurality of dielectric walls.

13. The method for forming the semiconductor structure as claimed in claim 12, further comprising:

forming a dielectric layer over the gate stack; and forming a gate connection structure in the dielectric layer, wherein the first gate electrode layer is electrically connected to the second gate electrode layer through the gate connection structure.

14. The method for forming the semiconductor structure as claimed in claim 11, further comprising:

forming an isolation structure extending through the gate stack and landing on a first dielectric wall of the plurality of dielectric walls.

15. The method for forming the semiconductor structure as claimed in claim 11, further comprising:

forming a plurality of epitaxial materials in source/drain regions of the plurality of active regions;

flipping the substrate upside down;

removing the substrate and lower fin elements of the plurality of active regions to form a plurality of trenches exposing the plurality of fin spacer layers and the plurality of epitaxial materials;

forming a dielectric layer in a first trench of the plurality of trenches; and forming a conductive line in a second trench of the plurality of trenches.

16. The method for forming the semiconductor structure as claimed in claim 11, wherein recessing the plurality of fin spacer layers comprises forming a concave surface on one of the plurality of fin spacer layers, and a first end of the concave surface jointed with one of the plurality of dielectric walls is higher than a second end of the concave surface jointed with one of the plurality of active regions, and the concave surface has a lowest point between the first end and the second end.

17. A semiconductor structure, comprising:

a first dielectric wall, a first set of nanostructures and a second dielectric wall sequentially arranged in a first horizontal direction;

a first gate electrode layer wrapping around the first set of nanostructures;

a source/drain feature adjoining the first set of nanostructures and sandwiched between the first dielectric wall and the second dielectric wall; and an inner spacer layer interposing between the first gate electrode layer and the source/drain feature and between the first set of nanostructures, wherein in a plan view, a first dimension of the inner spacer layer in the first horizontal direction is greater than a second dimension of the source/drain feature in the first horizontal direction.

18. The semiconductor structure as claimed in claim 17, further comprising:

a contact etching stop layer along the source/drain feature; and an interlayer dielectric layer over the contact etching stop layer, wherein in the plan view, the contact etching stop layer has a closed-loop profile between the first dielectric wall and the source/drain feature, and the interlayer dielectric layer includes a portion within the closed-loop profile of the contact etching stop layer.

19. The semiconductor structure as claimed in claim 17, further comprising:

a second set of nanostructures;

a second gate electrode layer wrapping around the second set of nanostructures, wherein the first dielectric wall is located between the first gate electrode layer and the second gate electrode layer; and a gate connection structure over the first dielectric wall and electrically connected to the first gate electrode layer and the second gate electrode layer.

20. The semiconductor structure as claimed in claim 17, further comprising:

a gate spacer layer alongside the first gate electrode layer and extending across the inner spacer layer, the first dielectric wall and the second dielectric wall.

* * * * *